United States Patent
Funaki

(10) Patent No.: US 10,224,080 B2
(45) Date of Patent: Mar. 5, 2019

(54) SEMICONDUCTOR MEMORY DEVICE WITH LATE WRITE FEATURE

(71) Applicant: Renesas Electronics Corporation, Tokyo (JP)

(72) Inventor: Toshihiko Funaki, Kodaira (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/371,062

(22) Filed: Dec. 6, 2016

(65) Prior Publication Data

US 2017/0194039 A1    Jul. 6, 2017

(30) Foreign Application Priority Data

Jan. 6, 2016  (JP) ................. 2016-000976

(51) Int. Cl.
| | |
|---|---|
| G11C 5/02 | (2006.01) |
| G11C 7/10 | (2006.01) |
| G11C 5/06 | (2006.01) |
| G11C 7/22 | (2006.01) |
| G11C 29/02 | (2006.01) |
| G11C 29/50 | (2006.01) |

(52) U.S. Cl.
CPC .............. *G11C 7/10* (2013.01); *G11C 5/02* (2013.01); *G11C 5/025* (2013.01); *G11C 5/06* (2013.01); *G11C 7/106* (2013.01); *G11C 7/109* (2013.01); *G11C 7/1087* (2013.01); *G11C 7/22* (2013.01); *G11C 29/023* (2013.01); *G11C 29/025* (2013.01); *G11C 29/028* (2013.01); *G11C 29/50012* (2013.01); *G11C 2207/229* (2013.01); *G11C 2207/2218* (2013.01)

(58) Field of Classification Search
CPC ....... H01L 2224/16145; H01L 25/0657; G11C 7/10; G11C 7/22; G11C 2207/229
See application file for complete search history.

(56) References Cited

U.S. PATENT DOCUMENTS

| | | | | |
|---|---|---|---|---|
| 6,144,616 A * | 11/2000 | Suzuki | ............... | G11C 7/1072 365/189.05 |
| 6,285,626 B2 | 9/2001 | Mizuno et al. | | |
| 6,959,367 B2 * | 10/2005 | Banno | ............... | G06F 9/30018 710/310 |
| 7,911,874 B2 * | 3/2011 | Kawabata | ............... | G11C 7/10 365/189.17 |
| 9,087,592 B2 * | 7/2015 | Sohn | ............... | G11C 11/1675 |
| 9,472,253 B2 * | 10/2016 | Narui | ............... | G11C 7/22 |

(Continued)

FOREIGN PATENT DOCUMENTS

JP    2007-066517 A    3/2007

*Primary Examiner* — Huan Hoang
(74) *Attorney, Agent, or Firm* — McGinn IP Law Group, PLLC

(57) ABSTRACT

A stack memory includes a base chip, a memory chip stacked over the base chip, and a via 42 provided between the base chip and the memory chip. The base chip has an external interface circuit and a late write control circuit. The external interface circuit externally receives/transmits write data and read data. The late write control circuit has at least a register storing write data externally supplied through the external interface circuit. The memory chip has a memory cell array and a late write control circuit having at least a register storing write data supplied from the register through the via.

10 Claims, 21 Drawing Sheets

(56) References Cited

U.S. PATENT DOCUMENTS

| | | | |
|---|---|---|---|
| 2008/0195793 A1* | 8/2008 | Noha | G06F 13/1673 |
| | | | 710/313 |
| 2012/0179866 A1* | 7/2012 | Davis | G06F 13/1626 |
| | | | 711/105 |
| 2012/0250387 A1* | 10/2012 | Kondo | G11C 5/02 |
| | | | 365/51 |

* cited by examiner

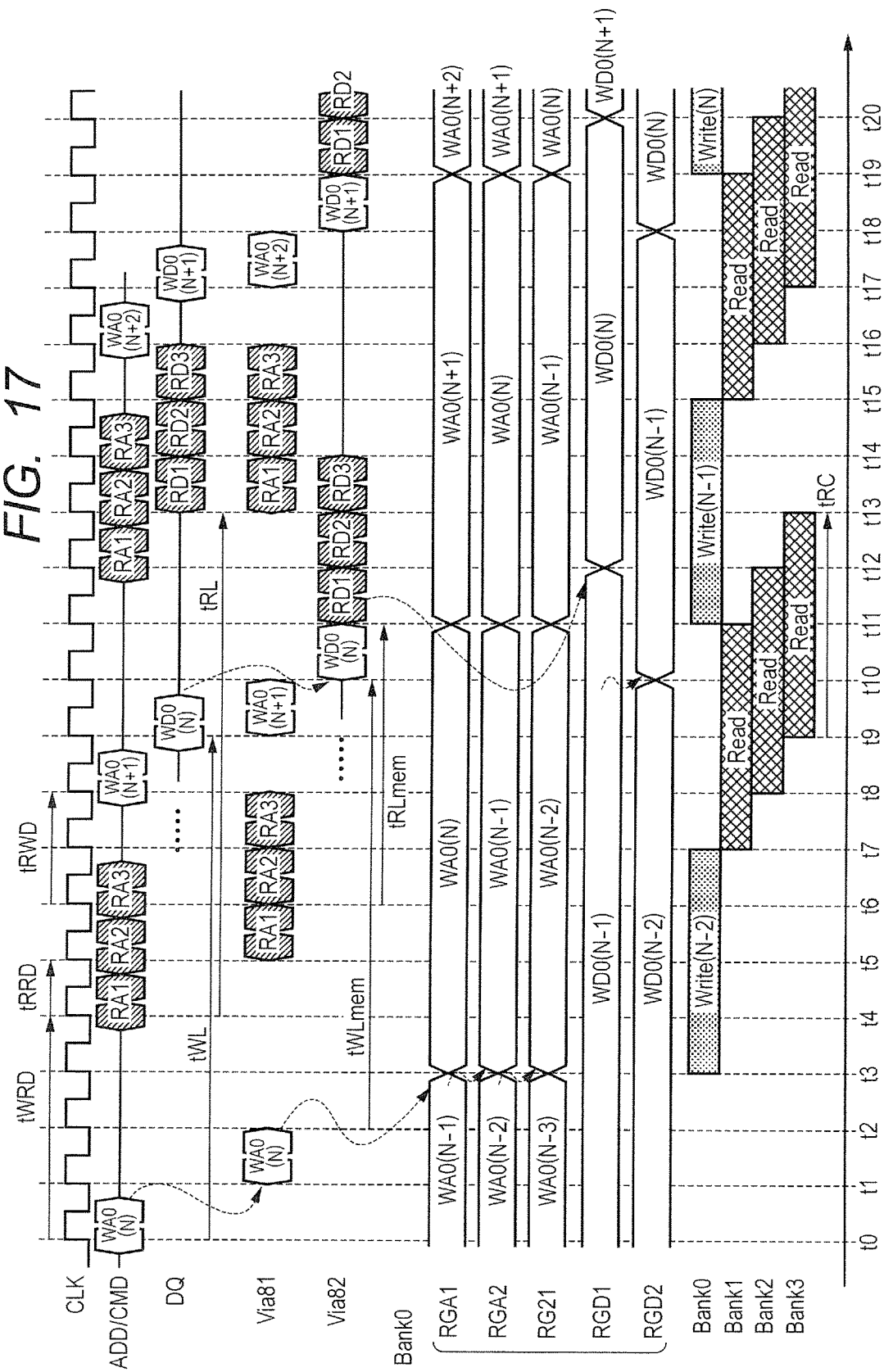

SEMICONDUCTOR MEMORY DEVICE WITH LATE WRITE FEATURE

CROSS-REFERENCE TO RELATED APPLICATIONS

The disclosure of Japanese Patent Application No. 2016-000976 filed on Jan. 6, 2016 including the specification, drawings and abstract is incorporated herein by reference in its entirety.

The present invention relates to a semiconductor memory device, and relates, for example, to a semiconductor memory device suitable for reducing an unnecessary bus cycle(s) required for switching between a command for writing data and a command for reading data.

BACKGROUND

Generally, in semiconductor memory devices, a length of write latency and a length of read latency are aligned uniformly, by intentionally delaying the write latency of data. By this uniform alignment, it is possible to eliminate periods (number of free cycles) of not propagating data, on a data line or an interface circuit for commonly propagating data to be read and data to be written. Thus, it enables to lower the number of bus cycles (bus turn around periods) required for switching between a command for writing data and a command for reading data. As a result, it enables to improve processing performance of the semiconductor memory device.

Japanese Unexamined Patent Application Publication No. 2007-66517 discloses, for example, a technique regarding late write (delayed write) for intentionally delaying write latency of data.

SUMMARY

In recent years, as the processing performance of the processor has improved, it is demanded to improve the processing performance of the semiconductor memory devices as well. Development of semiconductor memory devices with improved processing performance has proceeded, by forming a configuration in which a plurality of memory chips are stacked on the base chip, and a plurality of memory cells are simultaneously accessible. The semiconductor memory device with this configuration will hereinafter be referred to as a stack memory.

The base chip of the stack memory has a plurality of external interface circuits and a plurality of internal interface circuits. The external interface circuits receive/transmit data from/to the host chip, while the internal interface circuits receive/transmit data from/to the memory chips. To prevent an increase in the interface circuits, the external interface circuits and the internal interface circuits are commonly used for transmitting read data and transmitting write data.

It is necessary to adjust intervals between commands to avoid collision of the read data and the write data in the internal interface circuits, even if the length of the write latency and the length of the read latency in the entire stack memory are uniformly aligned, by simply applying the configuration of the late write disclosed in Japanese Unexamined Patent Application Publication No. 2007-66517 to the entire memory chips of the stack memory. If this adjustment is made, the length of the write latency and the length of the read latency in the single memory chip are not uniformly aligned. This results in a problem that the bus turn around period becomes long.

Any other objects and new features will be apparent from the descriptions of the present specification and the accompanying drawings.

According to an embodiment, there is provided a semiconductor memory device comprising a base chip, a first memory chip which is stacked over the base chip, and a first through via which is provided between the base chip and the first memory chip, and is used for transmitting read data and write data. The base chip has an external interface circuit which externally receives/transmits write data and read data, and a first late write control circuit which has at least a first register storing write data supplied externally through the external interface circuit. The first memory chip has a memory cell array which has a plurality of memory cells arranged in matrix, and a second late write control circuit which has at least a second register storing write data supplied from the first register through the first through via, and writes write data output from the second register into a target memory cell for writing.

According to the one embodiment, it is possible to provide a semiconductor memory device with improved processing performance, by reducing an unnecessary bus cycle required for switching between a command for writing data and a command for reading data.

BRIEF DESCRIPTION OF THE DRAWINGS

FIG. 17 is a timing chart illustrating operations of the stack memory illustrated in FIG. 15.

DETAILED DESCRIPTION

Figure 1:
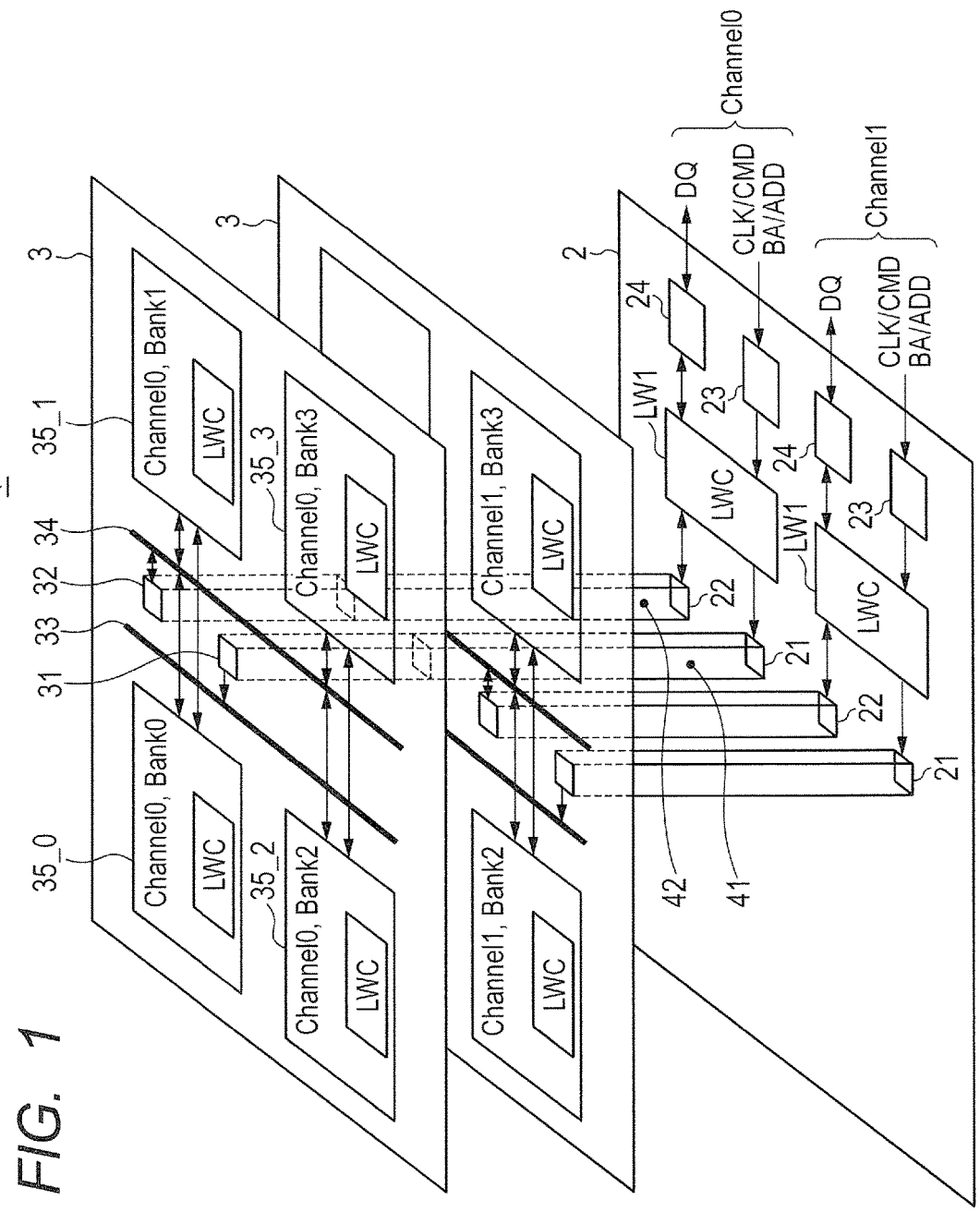
FIG. 1 is a diagram schematically illustrating a stacked structure of a stack memory according to an embodiment 1.

Preferred embodiments will now be described with reference to the accompanying drawings. The drawings are made in a simplified form, and thus should not be misconstrued as limiting the technical scope of the preferred embodiments based on the drawings. The same constituent elements are identified by the same reference numerals, and will not be described over and over.

In the following preferred embodiments, if necessary for convenience sake, descriptions will be made to divided plural sections or preferred embodiments, however, unless otherwise specified, they are not mutually irrelevant, but one is in relations of modifications, details, supplementary explanations of part or whole of the other. Further, in the following preferred embodiments, in the case of reference to the number of an element (including quantity, numeric value, amount, and range), unless otherwise specified and/or unless clearly limited in principle, the present invention is not limited to the specified number, and a number over or below the specified one may be used.

In the following preferred embodiments, the constituent elements (including operation steps) are not necessarily indispensable, unless otherwise specified and/or unless considered that they are obviously required in principle. Similarly, in the following preferred embodiments, in the reference of the forms of the constituent elements or the positional relationships, they intend to include those approximating or similar substantially to the forms and like, unless otherwise specified and/or unless considered that they are obviously not required in principle. This is also true of the foregoing numerical values (including quantity, numeric value, amount, and range).

<Prior Examination by Inventors>

Descriptions will now be made to a semiconductor memory device 7 which has been examined in advance by the present inventors, before specifically describing a semiconductor memory device according to an embodiment 1.

(Semiconductor Memory Device 50 According to Idea Before Arriving at Embodiment)

Figure 13:
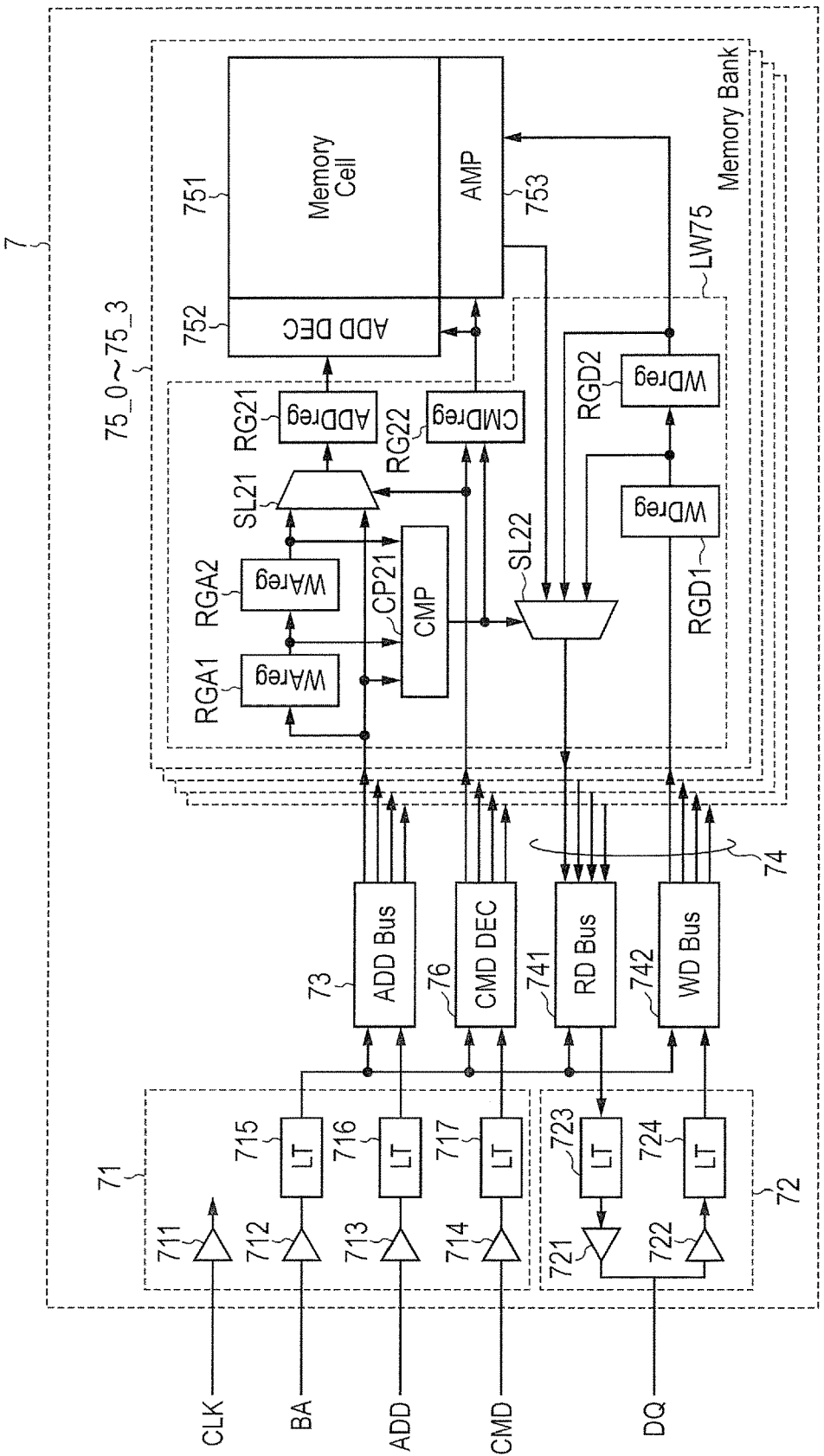
FIG. 13 is a block diagram illustrating a configuration example of a semiconductor memory device according to an idea before arriving at the embodiments.
Figure 14:
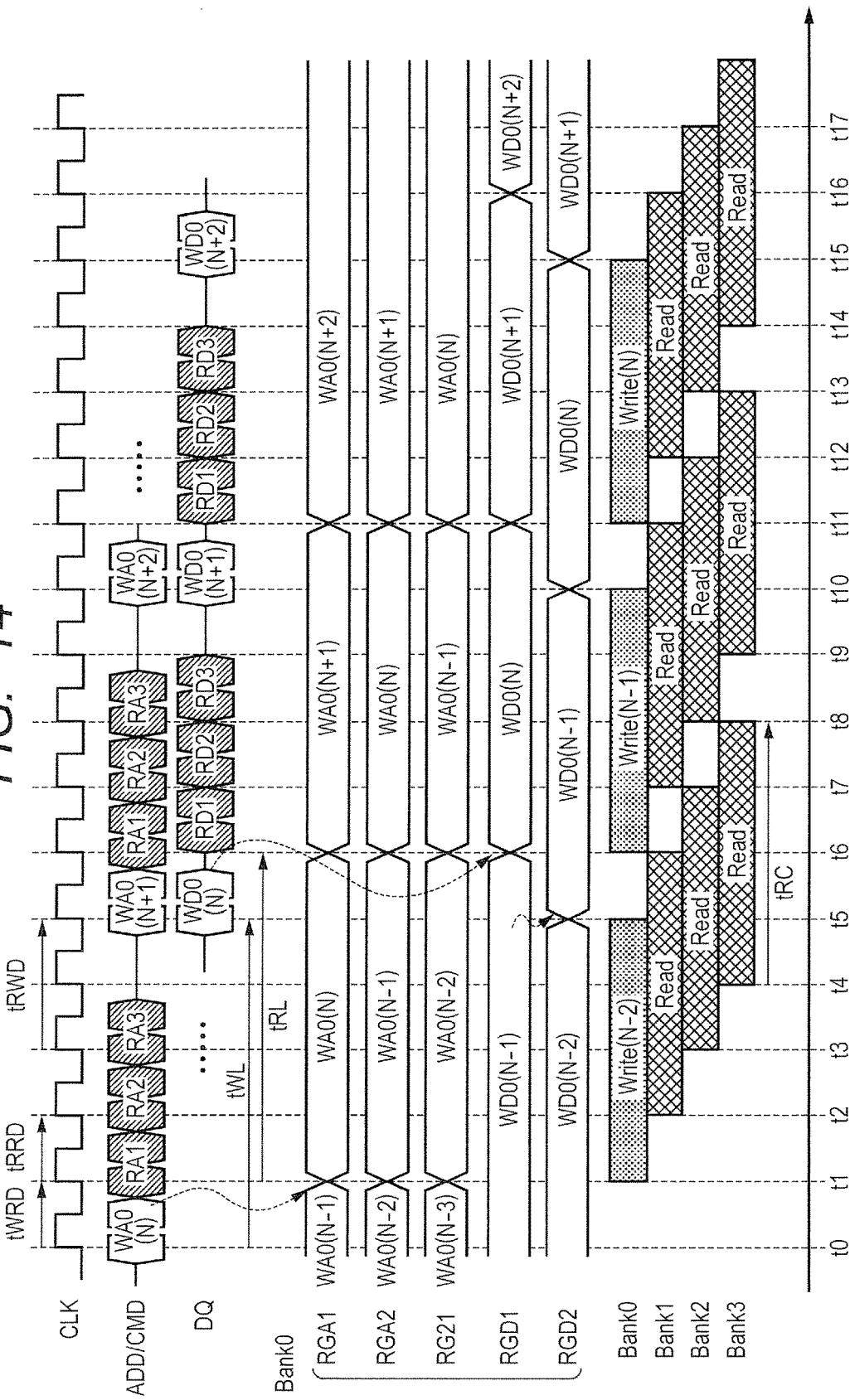
FIG. 14 is a timing chart illustrating operations of the semiconductor memory device illustrated in FIG. 13.

FIG. 13 is a block diagram illustrating a configuration example of a semiconductor memory device 50 according to the idea before arriving at the preferred embodiment. FIG. 14 is a timing chart illustrating operations of the semiconductor memory device 50 illustrated in FIG. 13.

In this embodiment, four memory banks are provided for each channel, two stages of FIFO are provided for late write, and the burst length is a two-cycle length. A double data rate (DDR) is adopted.

In this embodiment, tRC represents an interval necessary for successively accessing the same bank, tRRD represents an interval necessary for reading for a different bank after the read, tWRD represents an interval necessary for reading for different banks after the write, and tRWD represents an interval necessary for writing for different banks after the read. In the example of FIG. 14, the tRC has four cycles, the tRRD has one cycle, the tWRD has one cycle, and the tRWD has two cycles.

In FIG. 14, N is a natural number and represents the order of write command for the same banks, while WA0(N) represents a write address at an N-th time for Bank 0. WA0(N+1) represents a write address at an N+1-th time for the Bank 0. WD0(N) represents write data corresponding to the write address at the N-th time for the Bank 0. WD0(N+1) represents write data for the write address at the N+1-th time for the Bank 0. RA1, RA2, and RA3 represent read addresses respectively for the Bank 1, the Bank 2, and the Bank 3. RD1, RD2, and RD3 respectively represent read data for the RA1, the RA2, and the RA3.

As illustrated in FIG. 13, the semiconductor memory device 50 includes, on a chip 7, interface circuits 71 and 72, memory banks 75_0 to 75_3 (Banks 0 to 3), buses 73 and 74, and a command decoder (CMD DEC) 36. Each of the memory banks 75_0 to 75_3 will hereinafter be referred to simply also as a memory bank 75.

The interface circuit 72 is a circuit for receiving/transmitting data DQ from/to a circuit (for example, a host chip) provided outside the chip 7.

Specifically, the interface circuit 72 has an input buffer 722, a latch circuit 724, a latch circuit 723, and an output buffer 721. The input buffer 722 drives write data DQ supplied from the outside of the chip 7. The latch circuit 724 latches the write data DQ driven by the input buffer 722. The latch circuit 723 latches read data DQ read from a memory cell array 751. The output buffer 721 drives the read data DQ latched by the latch circuit 723 and outputs it to the outside of the chip 7.

The interface circuit 71 receives a clock signal CLK, a bank address signal BA, an address signal ADD, and a command signal CMD which are supplied from the outside of the chip 7, at the time of, for example, writing or reading data.

Specifically, the interface circuit 71 has an input buffer 711, an input buffer 712, a latch circuit 715, an input buffer 713, a latch circuit 716, an input buffer 714, and a latch circuit 717. The buffer 711 drives the clock signal CLK supplied from the outside of the chip 7. The buffer 712 drives the bank address signal BA supplied from the outside of the chip 7. The circuit 715 latches the bank address signal BA driven by the input buffer 712. The buffer 713 drives the address signal ADD supplied from the outside of the chip 7. The circuit 716 latches the address signal ADD driven by the input buffer 713. The buffer 714 drives the command signal CMD supplied from the outside of the chip 7. The circuit 717 latches the command signal CMD driven by the input buffer 714.

The address bus 73 is provided between the interface circuit 71 and the memory banks 75_0 to 75_3. A command decoder 76 decodes the command signal CMD received through the interface circuit 71.

The data bus 74 is provided between the interface circuit 72 and the memory banks 75_0 to 75_3. The data bus 74 is formed of a data bus 741 for propagating read data and a data bus 742 for propagating write data.

Each of the memory banks 75_0 to 75_3 includes a memory cell array 751 with a plurality of memory cells arranged in matrix, an address decoder 752 decoding an address signal, an amplifier 753 amplifying and outputting data read from the memory cells, and a late write control circuit LW75 intentionally delaying write data.

Specifically, the late write control circuit LW75 has registers RGA1 and RGA2, a selector SL21, a register RG21, a comparator CP21, a register RG22, registers RGD1 and RGD2, and a selector SL22.

The register RGA1 stores an address signal ADD which is supplied externally at the time of writing data. The register RGA2 stores the address signal ADD output from the register RGA1. That is, at the time of writing data, the address signal ADD is intentionally delayed by the registers RGA1 and RGA2.

The selector SL21 selects and outputs the address signal ADD output from the register RGA2 at the time of writing data, and directly selects and outputs the address signal ADD supplied through the address bus 73 at the time of reading data. The register RG21 stores the address signal ADD output from the selector SL21. The register RG22 stores a command signal CMD decoded by the command decoder 76.

The register RGD1 stores data DQ supplied externally at the time of writing data. The register RGD2 stores the data DQ output from the register RGD1. That is, the data DQ supplied externally at the time of writing data is delayed by the registers RGD1 and RGD2.

In the memory cell array 751, at the time of writing data, data is written into a memory cell corresponding to an address designated by the address signal ADD, and at the time of reading data, data is read from a memory cell corresponding to an address designated by the address signal ADD.

In this case, the data writing is intentionally delayed by the registers RGA1 and RGA2 and the registers RGD1 and RGD2 (that is, by intentionally delaying the write latency of data), thereby uniformly aligning the write latency and the read latency of data (as seen from FIG. 14, the length of the write latency tWL and the length of the read latency tRL are aligned uniformly). As a result, it is possible to reduce the periods (number of free cycles) of not propagating data, on the data line or the interface circuit which is used commonly by the read data and the write data. Thus, it is possible to lower the number of bus cycles (bus turn around periods) necessary for switching between a command for writing data and a command for reading data. As a result, it is possible to improve the processing performance of the semiconductor memory device 50.

The comparator CP21 compares the address signal ADD for reading supplied through the address bus 73 and the address signal ADD for writing stored in the registers RGA1 and RGA2, and outputs a compared result.

For example, when there is coincidence between the address signal ADD for reading supplied through the address bus 73 and the address signal ADD for writing stored in the register RGA1, the comparator CP21 outputs a value "1" as a compared result. When there is coincidence between the address signal ADD for reading supplied through the address bus 73 and the address signal ADD for writing stored in the register RGA2, the comparator CP21 outputs a value "2" as a compared result. When there is no coincidence between the address signal ADD for reading supplied through the address bus 73 and the address signal ADD for writing stored in the registers RGA1 and RGA2, the comparator CP21 outputs a value "0" as a compared result.

The selector SL22 selects and outputs either of the data DQ read from the memory cell array 751 and the data DQ stored in the registers RGD1 and RGD2, based on the compared result of the comparator CP21.

For example, when the comparator CP21 outputs the value "0" as the compared result, the selector SL22 selects and outputs the data DQ read from the memory cell array 751. When the comparator CP21 outputs the value "1" as the compared result, the selector SL22 selects and outputs the data DQ stored in the register RGD1, before written into the memory cell array 751. When the comparator CP21 outputs the value "2" as the compared result, the selector SL22 selects and outputs the data DQ stored in the register RGD2, before written into the memory cell array 751.

After a write command is input, before the write data is written into the memory cell array 751, a read command may be input for memory cells with the same address. In this case, before written into the memory cell array 751, the data DQ stored in the register RGD1 or RGD2 is output as read data.

Specifically, when there is coincidence between the address signal ADD for reading supplied through the address bus 73 and the address signal ADD stored in the register RGA1, the data DQ stored in the register RGD1 corresponding to the register RGA1 is output as read data. When there is coincidence between the address signal ADD for reading supplied through the address bus 73 and the address signal ADD stored in the register RGA2, the data DQ stored in the register RGD2 corresponding to the register RGA2 is output as read data.

In recent years, as the processing performance of the processor has improved, it is demanded that the processing performance of the semiconductor memory device improves as well. From this circumstance, the processing performance of the semiconductor memory device has improved, by forming a configuration in which a plurality of memory chips are stacked on the base chip receiving/transmitting data from/to the host chip, and in which a plurality of memory cells are simultaneously accessible. The semiconductor memory device having this configuration will hereinafter be referred to as a stack memory.

(Stack Memory 60 According to Idea Before Arriving at this Embodiment)

Figure 15:
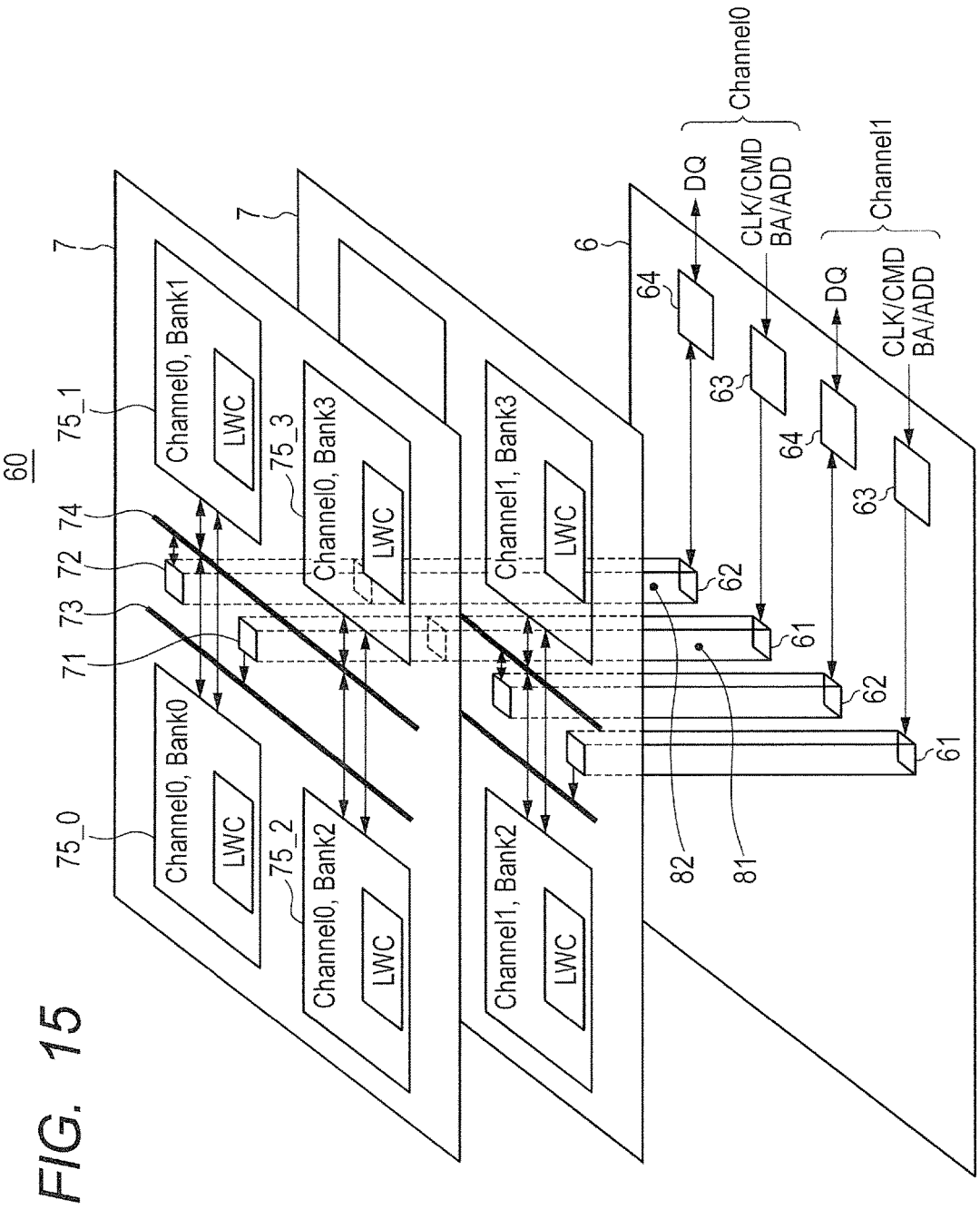
FIG. 15 is a diagram schematically illustrating a stacked structure of a stack memory according to an idea before arriving at the embodiments.
Figure 16:
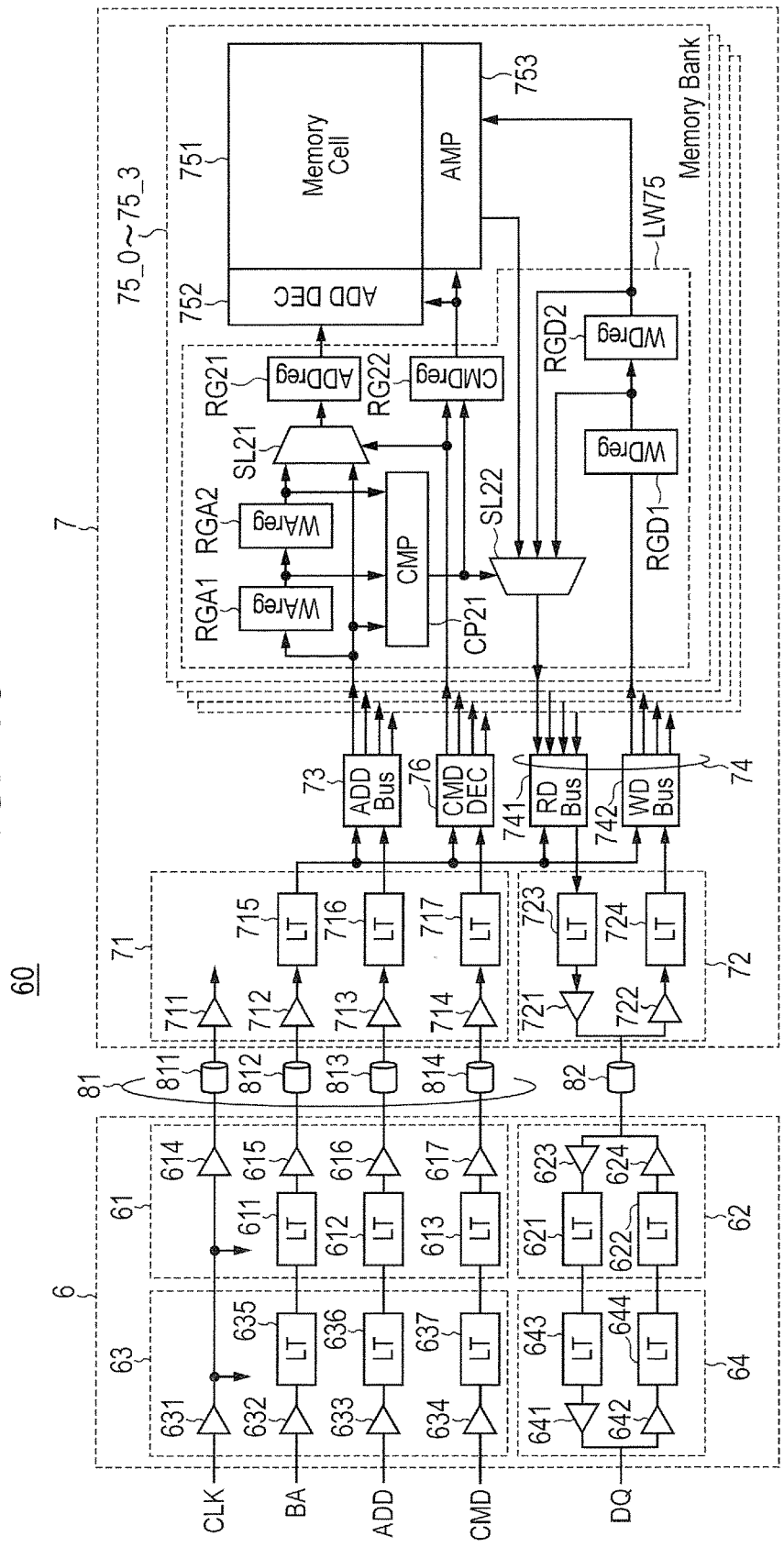
FIG. 16 is a block diagram illustrating a configuration example of a part of the stack memory illustrated in FIG. 15.

FIG. 15 is a diagram schematically illustrating a stacked structure of a stack memory (a semiconductor memory device) 60 according to the idea before arriving at this embodiment. FIG. 16 is a block diagram illustrating a configuration example of only one channel of the stack memory 60. FIG. 17 is a timing chart illustrating operations of the stack memory 60.

As illustrated in FIG. 15, the stack memory 60 includes a base chip 6 receiving/transmitting data from/to a host chip (not illustrated) and a plurality of memory chips 7 stacked over the base chip 6. In this example, two memory chips 7 are stacked over the base chip 6.

In this example, tWL represents write latency of the entire stack memory 60, tRL represents read latency of the entire stack memory 60, tRLmem represents read latency of the single memory chip 7, and tWLmem represents write latency of the single memory chip 7.

Over each of the memory chips 7, four memory banks 75_0 to 75_3 (Banks 0 to 3) of the same channel are arranged in matrix. The address bus 73 and the data bus 74 used commonly by the memory banks 75_0 to 75_3 are wired between the memory banks 75_0 and 75_2 and the memory banks 75_1 and 75_3. The interface circuits 71 and 72 are arranged near the center of the memory chip 7 and between the address bus 73 and the data bus 74.

Over the base chip 6, external interface circuits 63 and 64 and internal interface circuits 61 and 62 are arranged and correspond to each memory chip 7.

Through Silicon Vias (hereinafter simply referred to as vias) 81 and 82 are vertically provided between the interface circuits 71 and 72 arranged over each memory chip 7 and the internal interface circuits 61 and 62 arranged over the base chip 6.

The external interface circuits 63 and 64 are arranged along the external peripheral of the base chip 6, because it is necessary to suppress the consumption power by forming a physically short distance to the external device, such as a host chip. The internal interface circuits 61 and 62 are necessarily arranged opposed in a vertical direction to the interface circuits 71 and 72 arranged near the center of the memory chip 7, and thus are arranged near the center of the base chip 6. Therefore, the signal lines between the interface circuits 61 and 63 and the signal lines between the interface circuits 62 and 64 are all formed long.

Subsequently, descriptions will now be made to a specific configuration example of each block, using FIG. 16.

As illustrated in FIG. 16, the external interface circuit 64 provided near the external peripheral of the base chip 6 has an input buffer 642, a latch circuit 644, a latch circuit 643, and an output buffer 641. The buffer 642 drives write data DQ supplied externally from the outside of the stack memory 60. The circuit 644 latches the write data DQ driven by the input buffer 642. The circuit 643 latches the read data DQ. The buffer 641 drives the read data DQ latched by the latch circuit 643, and outputs externally from the stack memory 60.

The external interface circuit 63 provided near the external peripheral of the base chip 6 has an input buffer 631, an input buffer 632, a latch circuit 635, an input buffer 633, a latch circuit 636, an input buffer 634, and a latch circuit 637. The buffer 631 drives a clock signal CLK supplied from the outside of the stack memory 60. The buffer 632 drives a bank address signal BA. The circuit 635 latches the bank address signal BA driven by the input buffer 632. The buffer 633 drives an address signal ADD. The circuit 636 latches the address signal ADD driven by the input buffer 633. The buffer drives a command signal CMD. The circuit 637 latches the command signal CMD driven by the input buffer 634.

The internal interface circuit 62 provided near the center of the base chip 6 has a latch circuit 622, an output buffer 624, an input buffer 623, and a latch circuit 621. The circuit 622 latches the write data DQ latched by the latch circuit 644. The buffer 624 drives the write data DQ latched by the latch circuit 622, and outputs it to the memory chip 7 through the via 82. The buffer 623 drives the read data DQ supplied from the memory chip 7 through the via 82. The circuit 621 latches the read data DQ driven by the input buffer 623.

The internal interface circuit 61 provided near the center of the base chip 6 has an output buffer 614, a latch circuit 611, an output buffer 615, a latch circuit 612, an output buffer 616, a latch circuit 613, and an output buffer 617. The buffer 614 drives a clock signal CLK from the input buffer 631. The circuit 611 latches the bank address signal BA latched by the latch circuit 635. The output buffer 615 drives the bank address signal BA latched by the latch circuit 611. The circuit 612 latches the address signal ADD latched by the latch circuit 636. The buffer 616 drives the address signal ADD latched by the latch circuit 612. The circuit 613 latches the command signal CMD latched by the latch circuit 637. The buffer 617 drives the command signal CMD latched by the latch circuit 613.

The clock signal CLK driven by the output buffer 614 is supplied to the input buffer 711 of the memory chip 7 through a via 811 included in the via 81. The bank address signal BA driven by the output buffer 615 is supplied to the input buffer 712 of the memory chip 7, through a via 812 included in the via 81. The address signal ADD driven by the output buffer 616 is supplied to the input buffer 713 of the memory chip 7 through a via 813 included in the via 81. The command signal CMD driven by the output buffer 617 is supplied to the input buffer 714 of the memory chip 7 through a via 814 included in the via 81.

The configuration of the memory chip 7 is the same as that of the chip 7 illustrated in FIG. 13, and thus will not be described over and over.

As described above, provided over the base chip 6 of the stack memory 60 are a plurality of external interface circuits 64 receiving/transmitting data from/to the host chip and a plurality of internal interface circuits 62 receiving/transmitting data from/to the memory chip. To prevent an increase in the number of interface circuits, both of the external interface circuits 64 and the internal interface circuits 62 are commonly used for transmitting read data and transmitting write data.

It is necessary to adjust intervals between commands for avoiding collision of the read data and the write data in the internal interface circuits 62, even if the length of the write latency and the length of the read latency in the entire stack memory 60 (that is, in the external interface circuits 64) are uniformly aligned, by simply applying the configuration of the memory chip 7 to the stack memory 60. If this adjustment is made, the length of the write latency and the length of the read-latency in the single memory chip 7 are not uniformly aligned. This results in a problem that the bus turn around period becomes long.

More specifically, the long-distance signal lines between the interface circuits 62 and 64 wired over the base chip 6 are pipelined by the latch circuits in the interface circuits 62 and 64, while the long-distance signal lines between the interface circuits 61 and 63 wired over the base chip 6 are pipelined by the latch circuits in the interface circuits 61 and 63. Thus, the read latency tRL of the entire stack memory 60 is greater in value than the read latency tRLmem of the single memory chip 7. The internal interface circuit 62 for data transmission provided over the base chip 6 and the interface circuit 72 provided over the memory chip 7 are common interface circuits which are used commonly for the write data and the read data, like the external interface circuit 64 provided over the base chip 6.

To improve the processing performance of the stack memory 60, a plurality of memory cells are simultaneously accessible. Provided over the base chip 6 are a plurality of external interface circuits 64 for data transmission and a plurality of internal interface circuits 62. Thus, it may possibly increase the size of the circuits and also the consumption power. It is therefore possible to prevent an increase in the number of interface circuits, by using the interface circuits 62, 64, and 72 commonly used at least for transmitting read data and write data.

However, when the interface circuit is commonly used for transmitting the read data and the write data, not only the bus turn around period generated over the memory chip 7, but also the bus turn around period generated over the base chip 6 effects the bus turn around period of the stack memory 60. Specific descriptions will now be made using the timing chart of FIG. 17.

As seen from the timing chart of FIG. 17, the read latency tRL of the entire stack memory 60 is longer than the read latency tRLmem of the single memory chip 7 by the effected part of the pipelining by the latch circuit over the base chip 6. The write latency tWL of the entire stack memory 60 is adjusted to have the same length as the read latency tRL, by the late write control circuit LW75 provided in each memory chip 7. In this example, the write latency tWL is adjusted to have the same length as the read latency tRL, that is, nine cycles.

For example, if a write address WA0(N) as an N-th address signal corresponding to Bank0 is input (time t0), write data WD0(N) as N-th data DQ corresponding to the Bank0 is input after the nine cycles (time t9). The data WD0(N) propagates through the via 82 during the next period of the tenth cycle (times t10 to t11).

Thus, it is necessary that the read data RD1 propagate through the via 82 after (time t11 or after) the period in which the write data WD0(N) propagates through the via 82. The read data RD1 is read out upon input of a read address RA1 as the N-th address signal corresponding to Bank 1. In this example, the read address RD1 propagates through the via 82 in the period of the eleventh cycle (times t11 to t12).

Because the read latency tRL includes nine cycles, to input the read address RA1, it is necessary to wait until the fourth cycle (time t4), for the read data RD1 to propagate through the via 82 in the period of the eleventh cycle.

Therefore, the tWRD of the entire stack memory 60 includes at least four cycles, and is longer than the minimum one cycle of the tWRDmem of the single memory chip 7. As a result, the bus turn around period of the entire stack memory 60 becomes long. This brings a problem of deteriorating the processing performance of the entire stack memory 60.

It is supposed that the length of the write latency tWL is reduced to six cycles, to enable to input the read address RA1 in the first cycle (time t1). In this case, it is necessary to delay the input of a write address WA0(N+1), to prevent overlapping of a period in which the read data RD3 read upon input of the read address RA3 propagates through the via 82 and a period in which write data WD0(N+1) written upon input of the write address WA0(N+1) thereafter propagates through the via 82. Thus, tRWD of the entire stack memory 60 includes at least four cycles, and is longer than the minimum one cycle of the tRWDmem of the single memory chip 7. As a result, the bus turn around period of the entire stack memory 60 becomes long. This brings a problem of deteriorating the processing performance of the entire stack memory 60.

There is found a stack memory 1 according to this embodiment, to improve the processing performance by setting the short bus turn around period, like the case of the single memory chip.

(Stack Memory 1 According to this Embodiment)

Figure 2A:
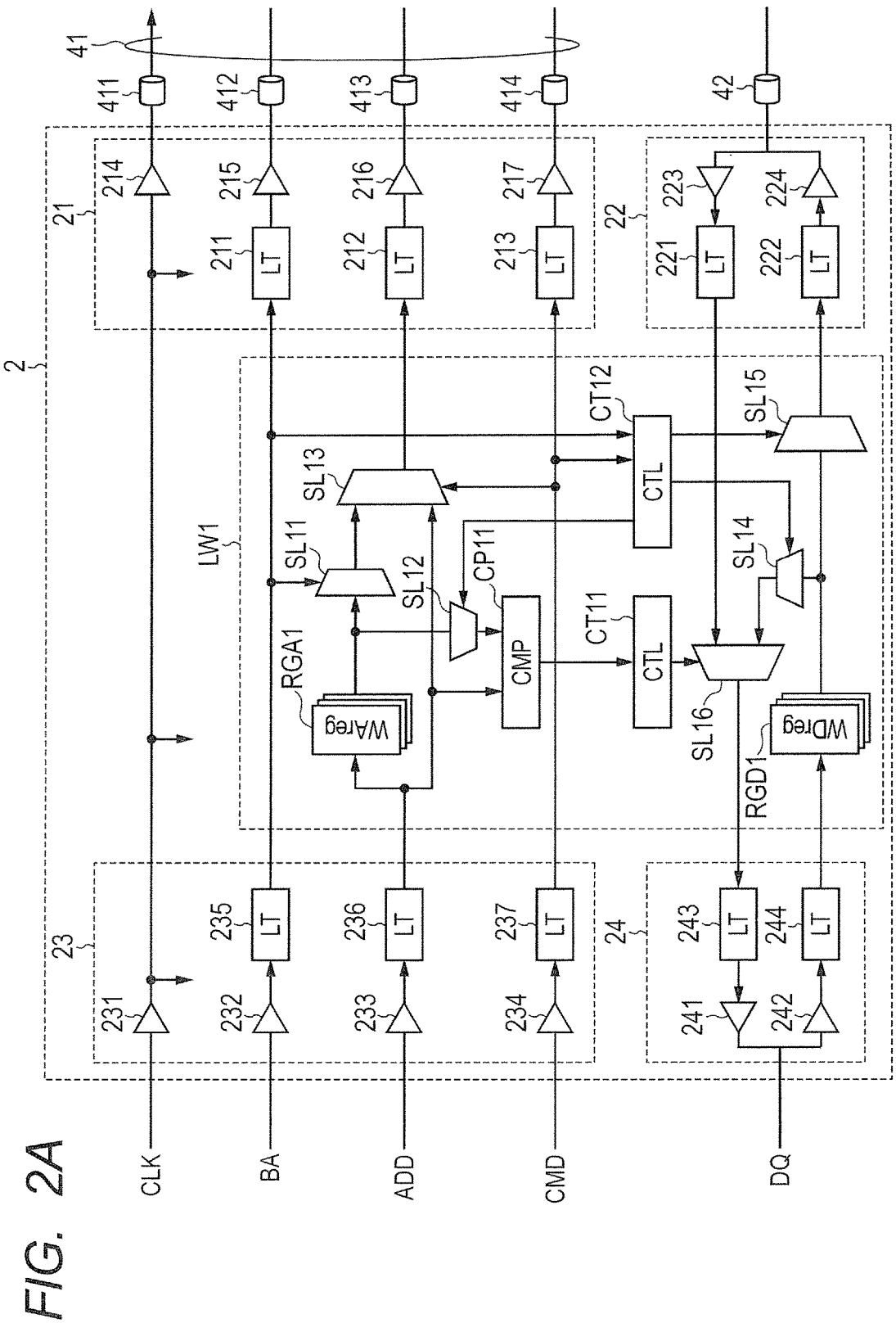
FIG. 2A is a block diagram illustrating a configuration example of the base chip side of the stack memory illustrated in FIG. 1.
Figure 2B:
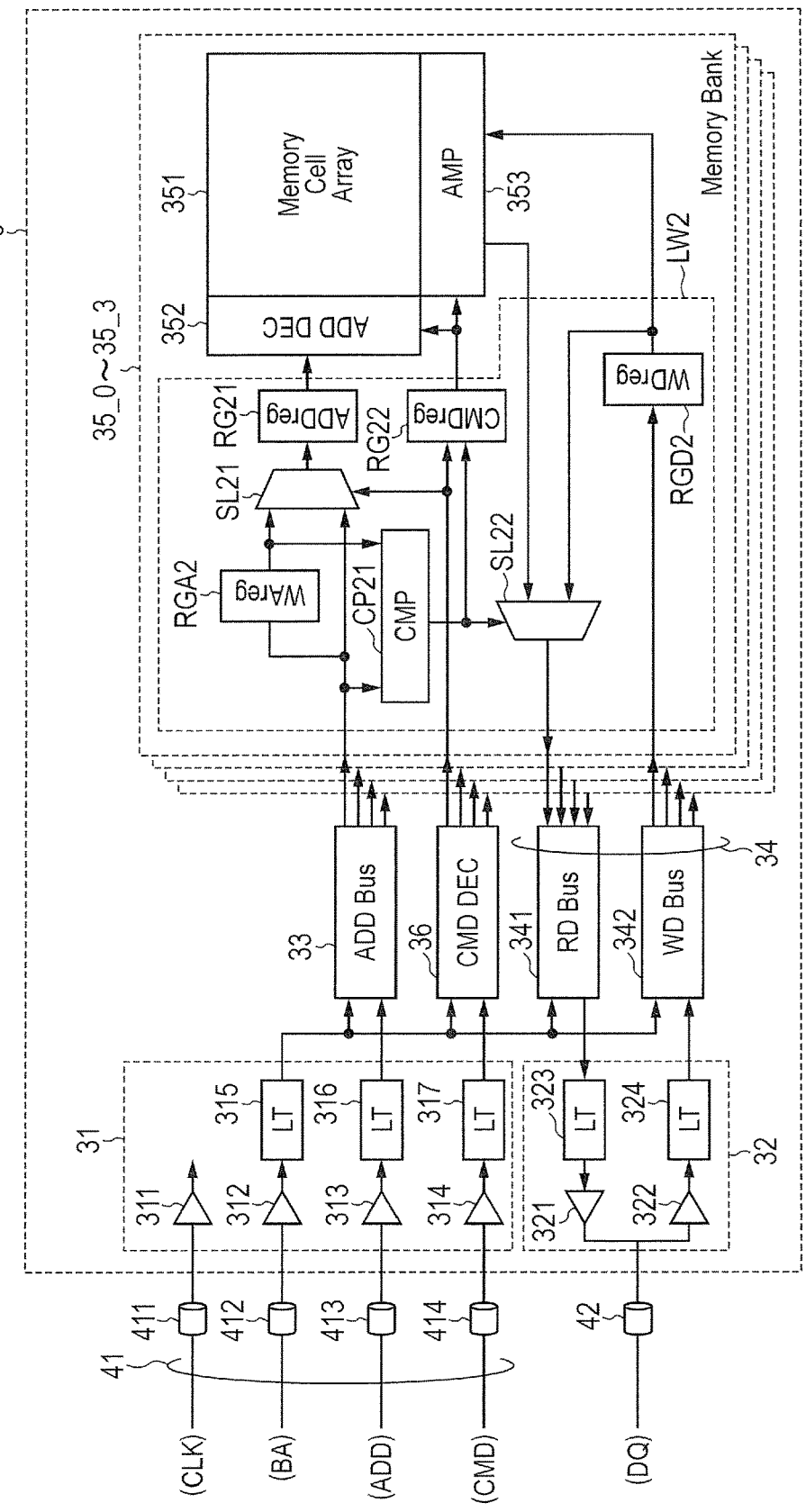
FIG. 2B is a block diagram illustrating a configuration example of a part of the memory chip side of the stack memory illustrated in FIG. 1.
Figure 3:
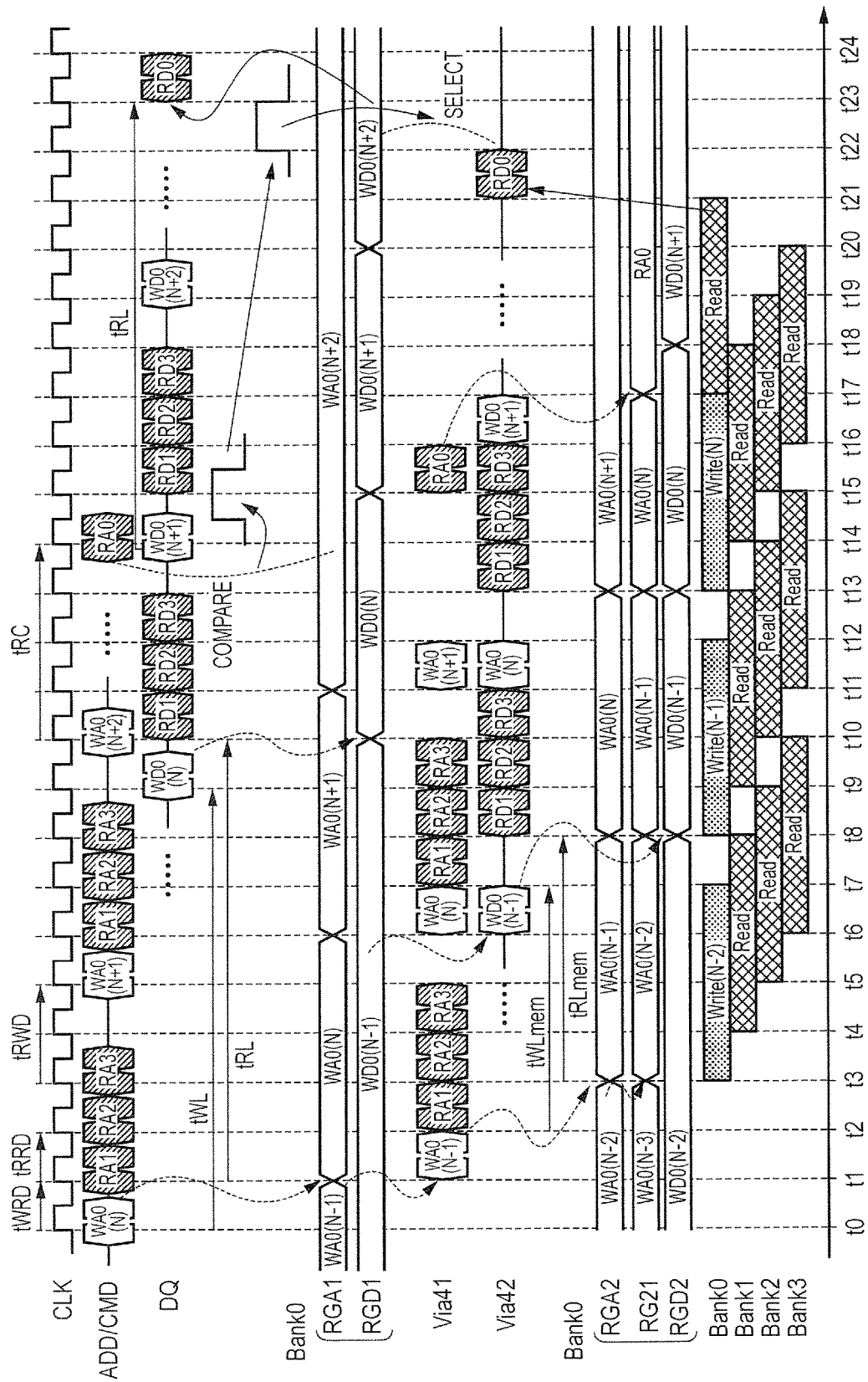
FIG. 3 is a timing chart illustrating operations of the stack memory illustrated in FIG. 1.

FIG. 1 is a diagram schematically illustrating a stacked structure of the stack memory (semiconductor memory device) 1 according to the embodiment 1. FIG. 2A is a block diagram illustrating a configuration example of the base chip side of the stack memory 1. FIG. 2B is a block diagram illustrating only one channel on the memory chip side of the stack memory 1. FIG. 3 is a timing chart illustrating operations of the stack memory 1.

In this embodiment, descriptions will now be made to a case in which four memory banks are provided for each channel, the number of stages of FIFO for late write is two (that is, one stage for the memory chip, and the other stage for the base chip), and the burst length is a two-cycle length. In this embodiment, descriptions will be made to a case in which the double data rate (DDR) system is adopted. The number of stages of FIFO for late write can be changed appropriately in accordance with the latency of the stack memory 1 and the single memory chip mounted thereon.

In this embodiment, tRC represents an interval necessary for successively accessing the same bank, tRRD represents an interval necessary for performing reading for different banks after the read, tWRD represents an interval necessary for performing reading for different banks after the write, and tRWD represents an interval necessary for performing writing for different banks after the read. In the example of FIG. 3, tRC includes four cycles, tRRD includes one cycle, tWRD includes one cycle, and tRWD includes two cycles.

In this embodiment, tWL represents write latency of the entire stack memory 1, tRL represents read latency of the entire stack memory 1, tRLmem represents read latency of a single memory chip 3, and tWLmem represents write latency of the single memory chip 3.

In FIG. 3, N is a natural number and represents the number of write command for the same bank, while WA0(N) represents a write address at an N-th time for Bank 0. WA0(N+1) represents a write address at an N+1-th time for the Bank 0. WD0(N) represents write data corresponding to the write address at the N-th time for the Bank 0. WD0(N+1) represents write data for the write address at the N+1-th time for the Bank 0. RA1, RA2, and RA3 represent read addresses respectively for the Bank 1, the Bank 2, and the Bank 3. RD1, RD2, and RD3 respectively represent read data for the RA1, the RA2, and the RA3.

As illustrated in FIG. 1, the stack memory 1 includes a base chip 2 receiving/transmitting data from/to the host chip (not illustrated) and a plurality of memory chips 3 stacked over the base chip 2. In this example, two memory chips 7 are stacked over the base chip 2.

Over each memory chip 3, four memory banks 35_0 to 35_3 (Banks 0 to 3) for each channel are arranged in matrix. An address bus 33 and a data bus 34 used commonly by the memory banks 35_0 to 35_3 are wired between the memory banks 35_0 and 35_2 and the memory banks 35_1 and 35_3. Interface circuits 31 and 32 are arranged near the center of the memory chip 3 between the address bus 33 and the data bus 34.

Over the base chip 2, external interface circuits 23 and 24, internal interface circuits 21 and 22, and a first late write control circuit LW1 correspond to each of the memory chips 3, and are provided over the base chip 2. The late write control circuit LW1 is provided between the internal interface circuits 21 and 22 and the external interface circuits 23 and 24.

Through Silicon Vias (hereinafter referred to as vias) 41 and 42 are vertically provided between the interface circuits 31 and 32 arranged over each memory chip 3 and the internal interface circuits 21 and 22 arranged over the base chip 2.

The external interface circuits 23 and 24 are arranged along the external peripheral of the base chip 2, because it is necessary to suppress the consumption power by forming a physically short distance to the external device, such as the host chip. The internal interface circuits 21 and 22 are necessarily arranged opposed in a vertical direction to the interface circuits 31 and 32 arranged near the center of the memory chip 3, and thus are arranged near the center of the base chip 2. Therefore, the signal lines between the interface circuits 21 and 23 and the signal lines between the interface circuits 22 and 24 are all formed long.

Subsequently, descriptions will now be made to a specific configuration example of each block, using FIG. 2A and FIG. 2B.

First, descriptions will be made to the configuration example of the side of the base chip 2, using FIG. 2A.

As illustrated in FIG. 2A, the external interface circuit 24 provided near the external peripheral of the base chip 2 has an input buffer 242, a latch circuit 244, a latch circuit 243, and an output buffer 241. The buffer 242 drives write data DQ supplied from the outside of the stack memory 1. The circuit 244 latches the write data DQ driven by the input buffer 242. The circuit 243 latches read data DQ. The buffer 241 drives the read data DQ latched by the latch circuit 243, and outputs it to the outside of the stack memory 1.

The external interface circuit 23 provided near the external peripheral of the base chip 2 has an input buffer 231, an input buffer 232, a latch circuit 235, an input buffer 233, a latch circuit 236, an input buffer 234, and a latch circuit 237. The buffer 231 drives a clock signal CLK supplied from the outside of the stack memory 1. The buffer 232 drives a bank address signal BA. The circuit 235 latches the bank address signal BA driven by the input buffer 232. The buffer 233 drives an address signal ADD. The circuit 236 latches the address signal ADD driven by the input buffer 233. The buffer 234 drives a command signal CMD. The circuit 237 latches the command signal CMD driven by the input buffer 234.

The late write control circuit LW1 provided over the base chip 2 is a circuit for intentionally delaying writing of data, and has a register RGA1, selectors SL11 to SL16, a comparator CP11, latency control circuits CT11 and CT12, and a register RGD1. The number of registers RGA1 and RGD1 which corresponds to the number of memory banks are provided in the same channel.

The register RGA1 stores the address signal ADD supplied externally through the interface circuit 23 at the time of writing data. That is, at the time of writing data, the address signal ADD is intentionally delayed by the register RGA1.

The selector SL11 selects and outputs the address signal ADD stored in the register RGA1 for a memory bank designated by the bank address signal BA.

At the time of writing data, the selector SL13 selects and outputs the address signal ADD selected by the selector SL11. At the time of reading data, it directly selects and outputs the address signal ADD supplied externally through the interface circuit 23.

The register RGD1 stores the data DQ supplied externally through the interface circuit 24 at the time of writing data. That is, at the time of writing data, the data DQ is intentionally delayed by the register RGD1.

The latency control circuit CT12 outputs a switching signal S2 in accordance with a command signal CMD and a bank address signal BA, after the elapse of a predetermined number of cycles since the command signal CMD and the bank address signal BA have been input.

The selector SL15 selects and outputs the data DQ stored in the register RGD1 for a memory bank designated by the bank address signal BA, of the provided registers RGD1, the number of which corresponds to the number of memory banks, at the time of writing data. In this case, the selector SL15 needs to switch the selection of the output source of data to be written, after the elapse of the number of cycles in accordance with the write latency tWL, because the late write control circuit LW1 is used commonly by a plurality of memory banks. Thus, the selector SL15 switches the selection of data to be written for a target bank for writing, after the elapse of the number of cycles in accordance with the write latency tWL, in response to a switching signal S2 from the latency control circuit CT12.

Of the provided registers RGA1, the number of which corresponds to the number of memory banks, the selectors SL12 selects and outputs an address signal ADD for writing, stored in the register RGA1 for a memory bank designated by the bank address signal BA. Because the late write control circuit LW1 is used commonly by the memory banks, the selector SL12 needs to switch the selection of the output source of the address for writing as a comparison target with the address for reading, after the elapse of the number of cycles in accordance with the read latency tRL. Thus, the selector SL12 switches the selection of the address for writing of the same bank as the bank designated by the bank address signal for reading, after the elapse of the number of cycles in accordance with the read latency tRL, in response to the switching signal S2 from the latency control circuit CT12.

The comparator CP11 compares an address signal ADD for reading supplied externally through the interface circuit 23 with an address signal ADD for writing selected by the selector SL12 (that is, the address signal ADD for writing for the same memory bank, stored in the register RGA1), and outputs a compared result.

For example, when there is coincidence between the address signal ADD for reading supplied externally through the interface circuit 23 and the address signal ADD for writing for the same memory bank stored in the register RGA1, the comparator CP11 outputs a value "1" as a compared result. When there is no coincidence therebetween, the comparator outputs a value "0" as a compared result.

The latency control circuit CT11 outputs a switching signal S1 in accordance with the compared result, after the elapse of the predetermined number of cycles since the compared result of the comparator CP11 has been input.

Of the provided registers RGD1 the number of which corresponds to the number of memory banks, the selector SL14 selects and outputs the data DQ for writing stored in the register RGD1 for the memory bank designated by the bank address signal BA. Because the late write control circuit LW1 is used commonly by the memory banks, the selector SL14 needs to switch the selection of the output source of the data for reading, after the elapse of the number of cycles in accordance with the read latency tRL. The selector SL14 switches the selection of data for writing for the same bank as the bank designated by the bank address signal for reading, after the elapse of the number of cycles in accordance with the read latency tRL, in response to the switching signal S2 from the latency control circuit CT12.

The selector SL16 selects and outputs either of the data DQ read from a memory cell array 351 and supplied through the interface circuit 22 and the data DQ for writing selected by the selector SL14 (that is, the data DQ for writing for the same memory bank stored in the register RGD1), based on the compared result of the comparator CP11.

For example, when the comparator CP11 outputs the value "0" as a compared result, the selector SL16 selects and outputs the data DQ read from the memory cell array 351 and supplied through the interface 22. When the comparator CP11 outputs the value "1" as a compared result, it selects and outputs the data DQ stored in the register RGD1 and before written into the memory cell array 351.

That is, the selector SL16 needs to switch the selection of the output source of the data for reading, after the elapse of the number of cycles in accordance with the read latency tRL. The selector SL16 switches the selection of the output source of data for reading, after the elapse of the number of cycles in accordance with the read latency tRL, in response to the switching signal S1 from the latency control circuit CT11.

The internal interface circuit 22 provided near the center of the base chip 2 has a latch circuit 222, an output buffer 224, an input buffer 223, and a latch circuit 221. The buffer 222 latches write data DQ output from the selector SL15 of the late write control circuit LW1. The buffer 224 drives the write data DQ latched by the latch circuit 222, and outputs it to the memory chip 3 through the via 42. The buffer 223 drives the read data DQ supplied from the memory chip 3 through the via 42. The circuit 221 latches the read data DQ driven by the input buffer 223.

The internal interface circuit 21 provided near the center of the base chip 2 has an output buffer 214, a latch circuit 211, an output buffer 215, a latch circuit 212, an output buffer 216, a latch circuit 213, and an output buffer 217. The buffer 214 drives a clock signal CLK from the input buffer 231. The circuit 211 latches a bank address signal BA latched by the latch circuit 235. The buffer 215 drives the bank address signal BA latched by the latch circuit 211. The circuit 212 latches an address signal ADD output from the selector SL13 of the late write control circuit LW1. The buffer 216 drives the address signal ADD latched by the latch circuit 212. The circuit 213 latches a command signal CMD latched by the latch circuit 237. The buffer 217 drives the command signal CMD latched by the latch circuit 213.

The clock signal CLK driven by the output buffer 214 is supplied to an input buffer 311 of the memory chip 3 through a via 411 included in a via 41. The bank address signal BA driven by the output buffer 215 is supplied to the input buffer 312 of the memory chip 3 through a via 412 included in the via 41. The address signal ADD driven by the output buffer 216 is supplied to an input buffer 313 of the memory chip, through a via 413 included in the via 41. The command signal CMD driven by the output buffer 217 is supplied to an input buffer 314 of the memory chip 3, through a via 414 included in the via 41.

Subsequently, descriptions will now be made to a configuration example of the memory chip 3, using FIG. 2B.

As illustrated in FIG. 2B, the interface circuit 32 has an input buffer 322, a latch circuit 324, a latch circuit 323, and an output buffer 321. The buffer 322 drives write data DQ supplied through the via 42. The circuit 324 latches the write data driven by the input buffer 322. The circuit 323 latches read data DQ read from the memory cell array 351. The buffer 321 drives the read data DQ latched by the latch circuit 323, and outputs it to the via 42.

The interface circuit 31 has an input buffer 311, an input buffer 312, a latch circuit 315, an input buffer 313, a latch circuit 316, an input buffer 314, and a latch circuit 317. The buffer 311 drives a clock signal CLK supplied through the via 411. The buffer 312 drives a bank address signal BA supplied through the via 412. The circuit 315 latches the bank address signal driven by the input buffer 312. The buffer 313 drives an address signal ADD supplied through the via 413. The circuit 316 latches the address signal ADD driven by the input buffer 313. The buffer 314 drives a command signal CMD supplied through the via 414. The circuit 317 latches the command signal CMD driven by the input buffer 314.

The address bus 33 is provided between the interface circuit 31 and the memory banks 35_0 to 35_3. The command decoder 36 is a circuit for decoding the command signal CMD received through the interface circuit 31.

The data bus 34 is provided between the interface circuit 32 and the memory banks 35_0 to 35_3. The data bus 34 is formed of a data bus 341 for propagating read data and a data bus 342 for propagating write data.

Each of the memory banks 35_0 to 35_3 includes a memory cell array 351, an address decoder 352, an amplifier 353, and a second late write control circuit LW2. The array 351 has a plurality of memory cells arranged in matrix. The decoder 352 decodes an address signal. The amplifier 353 amplifies and outputs data read from the memory cells. The circuit LW2 intentionally delays writing of data.

Specifically, the late write control circuit LW2 has the register RGA2, the selector SL21, the register RG21, the comparator CP21, the register RG22, the register RGD2, and the selector SL22.

The register RGA2 receives and stores the address signal ADD output from the register RGA1 on the base chip 2, through the interface circuit 21, the via 41, the interface circuit 31, and the address bus 33. That is, at the time of writing data, the address signal ADD is intentionally delayed also by the register RGA2 in addition to the register RGA1.

At the time of writing data, the selector SL21 selects and outputs an address signal ADD output from the register RGA2. At the time of read data, it directly selects and outputs the address signal ADD supplied through the address bus 33. The register RG21 stores the address signal ADD output from the selector SL21. The register RG22 stores the command signal CMD decoded by the command decoder 36.

The register RGD2 receives and stores the data DQ output from the register RGD1 on the base chip 2, through the interface circuit 22, the via 42, the interface circuit 32, and the data bus 342. That is, the data DQ supplied externally at the time of writing data is delayed also by the register RGD2 in addition to the register RGD1.

In the memory cell array 351, at the time of writing data, data is written in the memory cell of the address designated by the address signal ADD. At the time of reading data, data stored in the memory cell of the address designated by the address signal ADD is read.

In this case, the data writing is intentionally delayed by the registers RGA2 and RGD2 arranged over the memory chip 3, thereby uniformly aligning the length of the write latency tWLmem and the length of the read latency tRLmem in the single memory chip 3. Further, the data writing is intentionally delayed also by the registers RGA1 and RGD1 arranged on the base chip 2, thereby uniformly aligning the length of the write latency tWL and the length of the read latency tRL in the entire stack memory 1. At this time, there does not occur collision of data reading and data writing in the internal interface circuit, even without adjusting the bus turn around period to a long period. Thus, it is possible to shorten the bus turn around period in the entire stack memory 1. As a result, it is possible to improve the processing performance of the stack memory 1.

The comparator CP21 compares the address signal ADD for reading supplied through the address bus 33 with the address signal ADD for writing stored in the register RGA2, and outputs a compared result.

For example, when there is coincidence between the address signal ADD for reading supplied through the address bus 33 and the address signal ADD for writing stored in the register RGA2, the comparator CP21 outputs a value of "1" as a compared result. When there is no coincidence therebetween, it outputs the value "0" as a compared result.

The selector SL22 selects and outputs either the data DQ read from the memory cell array 351 and the data DQ for writing stored in the register RGD2, based on the compared result of the comparator CP21.

For example, when the comparator CP21 outputs the value "0" as the compared result, the selector SL22 selects and outputs the data DQ read from the memory cell array 351. When the comparator CP21 outputs the value "1" as the compared result, it selects and outputs the data DQ written in the memory cell array 351 and stored in the register RGD2.

After the write command is input, before the write data is written in the memory cell array 351, the read command for the memory cells with the same address may be input. In this case, the data DQ stored in the register RGD1 or RGD2, before written in the memory cell array 351, is output as read data.

Specifically, when there is coincidence between the address signal ADD for data reading supplied externally through the interface circuit 23 provided on the base chip 2 and the address signal ADD stored in the register RGA1 on the base chip 2, the data DQ stored in the register RGD1 corresponding to the register RGA1 is output as read data. When there is coincidence between the address signal ADD for data reading supplied through the address bus 33 and the address signal ADD stored in the register RGA2 on the memory chip 3, the data DQ stored in the register RGD2 corresponding to the register RGA2 is output as read data.
(Operation of Stack Memory 1)

Subsequently, descriptions will now be made to operations of the stack memory 1, using the timing chart of FIG. 3.

As illustrated in FIG. 3, for example, upon input of a command signal CMD for instructing data writing for the Bank0 and a write address WA0(N) (time t0), the write address WA0(N) is stored in the register RGA1 for the Bank0 arranged over the base chip 2 (time t1).

In this case, a write address WA0(N−1) stored already in the register RGA1 for the Bank0 is transferred to the memory chip 3 through the via 41 through a pipeline process, and stored in the register RGA2 for the Bank0 (memory bank 35_0) (time t3). A write address WA0(N−2) stored already in the register RGA2 for the Bank0 is stored in the register RG21 in the rear stage (time t3), through the pipeline process. Thereafter, the same pipeline process is performed also for write addresses WA0(N+1) and WA0(N+2).

When the write address WA0(N) is input (time t0), write data WD0(N) is input after the nine cycles (time t9). In the next cycle, it is stored in the register RGD1 for the Bank0 arranged on the base chip 2 (time t10).

The write data WD0(N−1) stored already in the register RGD1 for the Bank0 is transferred to the memory chip 3 through the via 42 before overwritten with the write data WD0(N) (times t6 to t7), and stored in the register RGD2 for the Bank0 (memory bank 35_0) (time 8). Note that the write data WD0(N−2) already stored in the register RGD2 for the Bank0 has already been written in the memory cell array 351, when the last write command is input. Therefore, it is overwritten with the write data WD0(N−1). After this, the same pipeline process is performed for the write data WD0(N+1) and WD0(N+2).

After this, for example, when the command signal CMD for instructing data reading for the Bank0 and a read address RA0 are input (time t14), a comparison is made between the read address RA0 and the write address stored in the register RGA1 for the Bank0 arranged on the base chip 2 (time t15).

When there is coincidence therebetween, after the read command is input (time t14), after the elapse of the read latency tRL (nine cycles), the write data stored in the register RGD1 for the Bank0 arranged on the base chip 2 is read as read data (time t23). On the other hand, when there is no coincidence therebetween, after the read command is input (time t14), after the elapse of the read latency tRL (nine cycles), the read data read from the memory cell array 351 through the via 42 (time t23).

The late write control circuit LW1 arranged on the base chip 2 is used commonly by the memory banks 35_0 to 35_3, the compared result between the read address RA0 and the write address stored in the register RGA1 for the Bank0 arranged on the base chip 2 is handled in the pipeline process by the latency control circuit CT11. That is, the compared result is supplied to the selector SL16, after the elapse of the number of cycles (for example, eight cycles which is one less than the read latency tRL) in accordance with the read latency tRL (time t22). As a result, the selection of the output source of the read data is switched (time t23).

The write data stored in the register RGD1 arranged on the base chip 2 is newer data than the write data stored in the register RGD2 arranged in the memory chip 3. Thus, when there is no coincidence between the read address RA0 and any of the write address stored in the register RGA1 and the write address stored in the register RGA2, the write data stored in the register RGD1 may be used as read data.

In this manner, in the stack memory 1 according to this embodiment, the late write control circuit LW2 is provided over each memory chip 3, and the late write control circuit LW1 is provided also over the base chip 2. By this configuration, the length of the write latency tWLmem and the length of the read latency tRLmem of the single memory chip 3 are uniformly aligned, and also the length of the write latency tWL and the length of the read latency tRL of the entire stack memory 1 are uniformly aligned. At this time, there does not occur collision of read data and write data in the internal interface circuit, even without adjusting the bus turn around period to a long period. This enables to shorten the bus turn around period in the entire stack memory 1. As a result, it is possible to improve the processing performance of the stack memory 1.

In this embodiment, the descriptions have been made to the case in which two memory chips 3 are stacked over the base chip 2. It is not limited to this case, and three or more memory chips 3 may be stacked over the base chip 2.

As described, in this embodiment, in the late write control circuit LW1 arranged over the base chip 2, there is provided one stage of register RGD1 storing the write data. In addition, in the late write control circuit LW2 arranged in each of the memory banks 35_0 to 35_3 of each memory chip 3, one stage of register RGD2 storing the write data is provided. However, it is not limited to example. For example, two stages or more pipelined registers RGD1 and two stages or more pipelined registers RGD2 may be provided. Note that it is necessary to increase the number of stages of the registers RGA1 and RGA2, in accordance with the number of stages of the registers RGD1 and RGD2.

Embodiment 2

Figure 4:
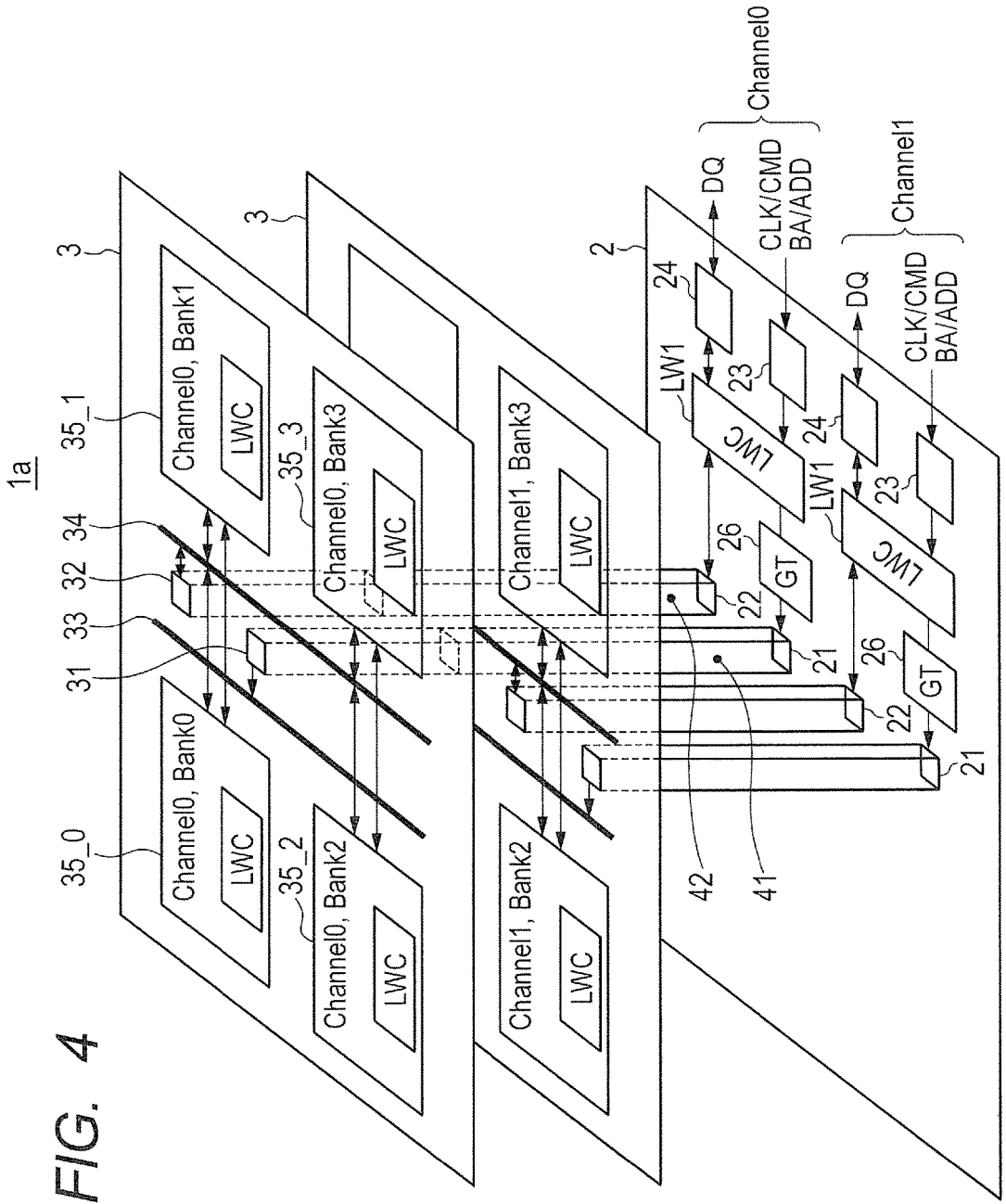
FIG. 4 is a diagram schematically illustrating a stacked structure of a stack memory according to an embodiment 2.
Figure 5A:
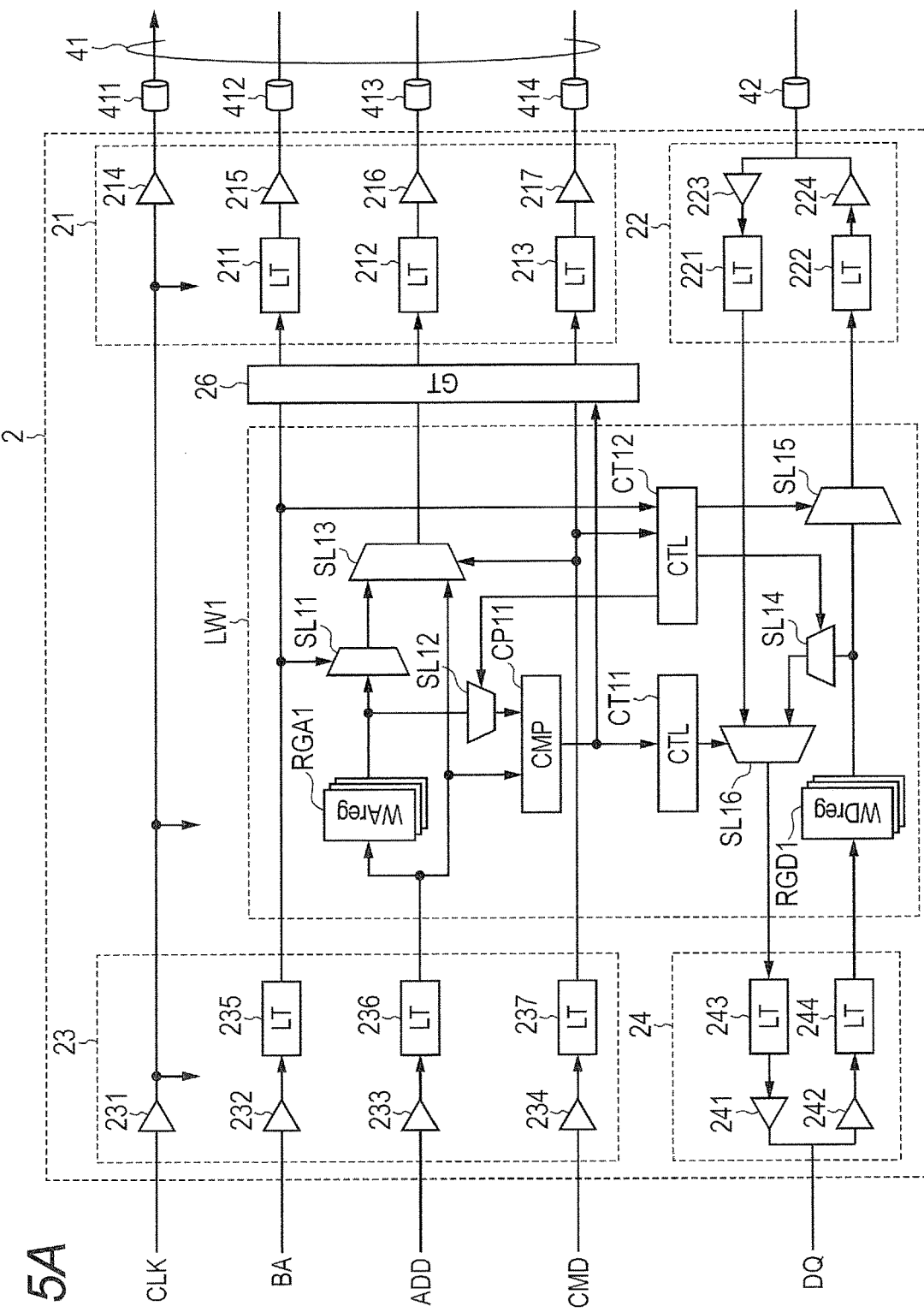
FIG. 5A is a block diagram illustrating a configuration example of the base chip side of the stack memory illustrated in FIG. 4.
Figure 5B:
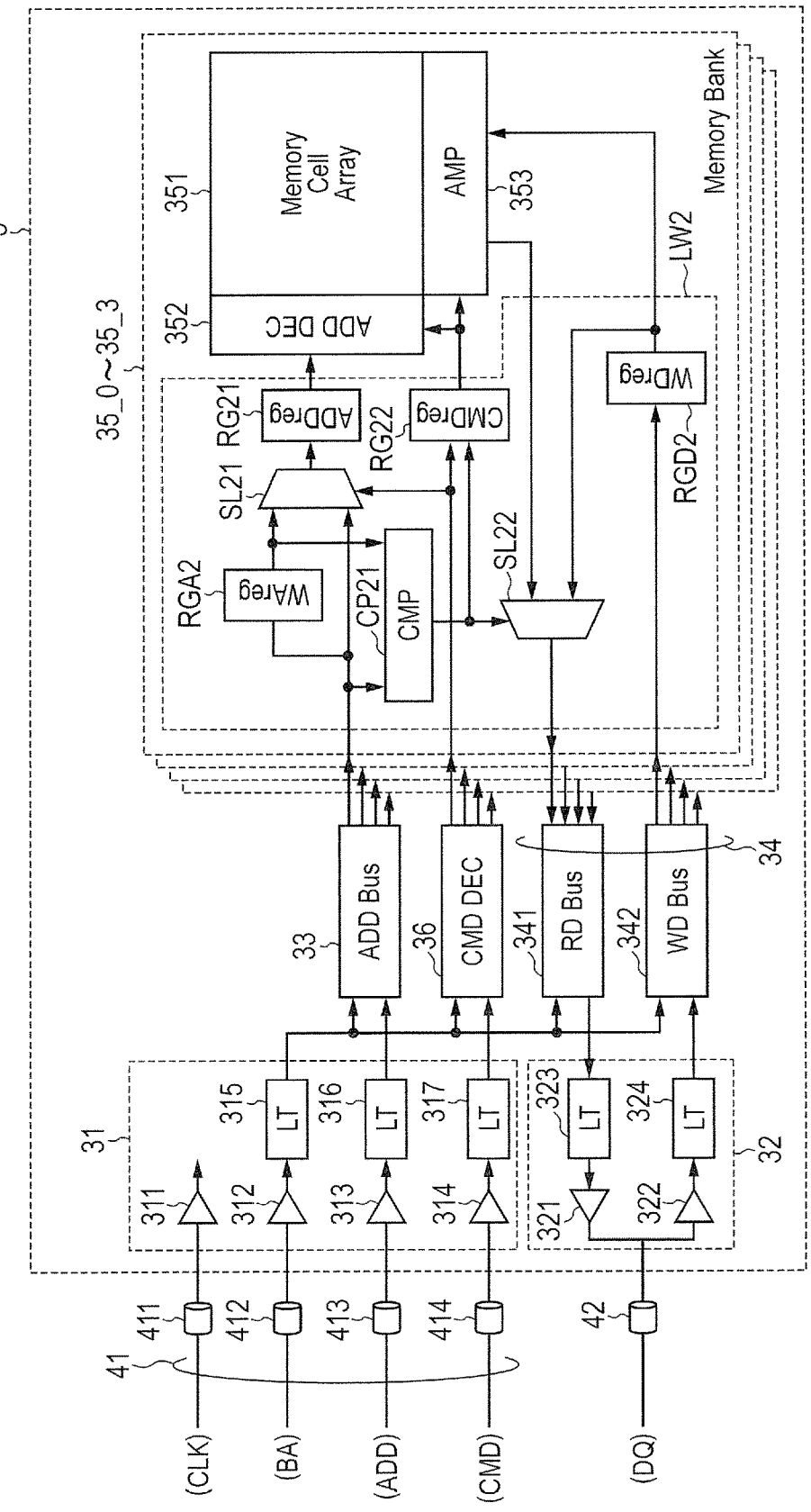
FIG. 5B is a block diagram illustrating a configuration example of a part of the memory chip side of the stack memory illustrated in FIG. 4.
Figure 6:
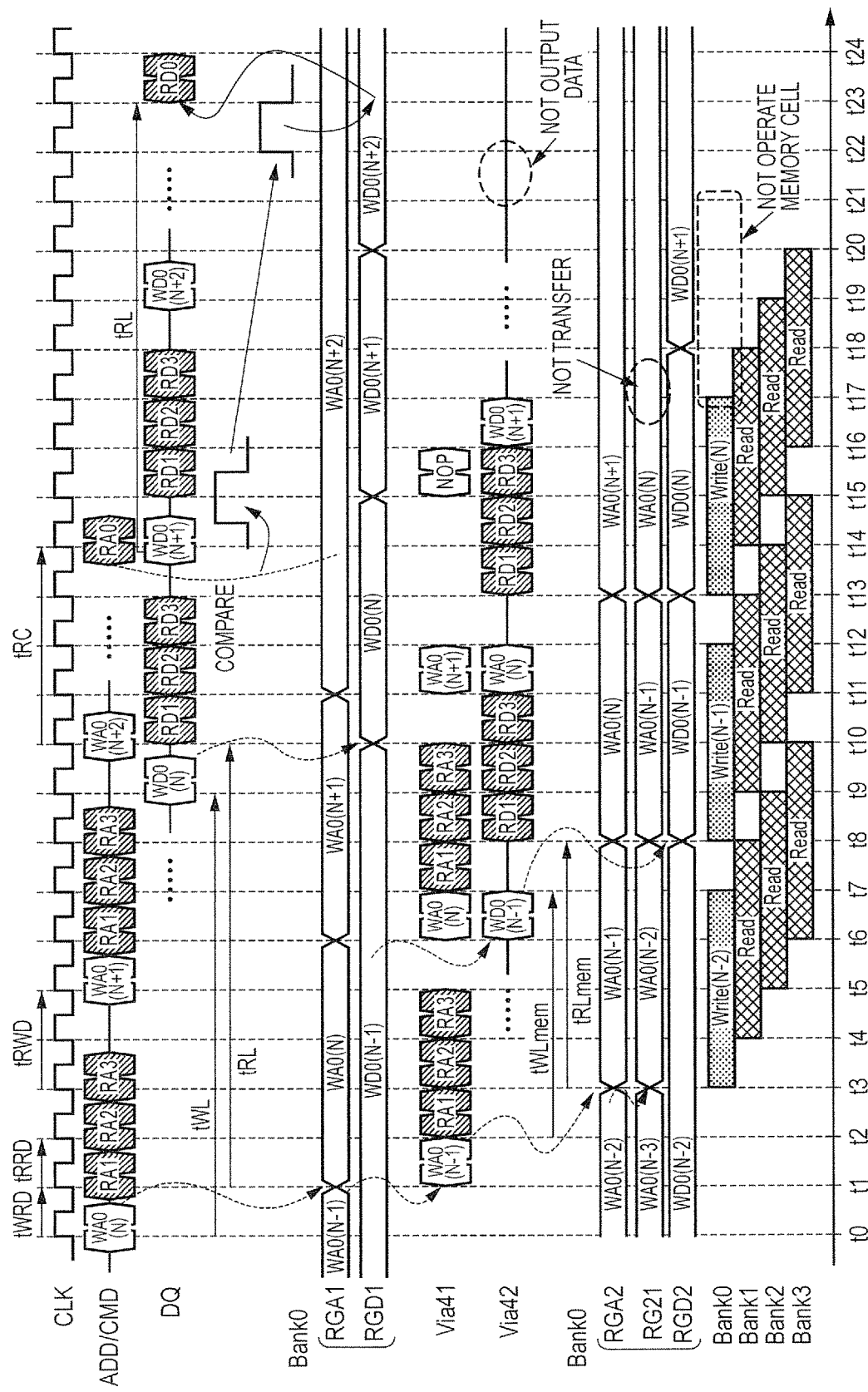
FIG. 6 is a timing chart illustrating operations of the stack memory illustrated in FIG. 4.

FIG. 4 is a diagram schematically illustrating a stacked structure of a stack memory 1a according to an embodiment 2. FIG. 5A is a block diagram illustrating a configuration example of the base chip side of the stack memory 1a. FIG. 5B is a block diagram illustrating only one channel of the memory chip side of the stack memory 1a. FIG. 6 is a timing chart illustrating operations of the stack memory 1a.

Unlike the stack memory 1, the stack memory 1a includes gating circuits (GT) 26 corresponding to each memory chip, between the late write control circuit LW1 over the base chip 2 and the via 41 for transmitting the address signal or the like. Any other configurations of the stack memory 1a are the same as those of the stack memory 1, and thus will not be described over and over.

As described above, the write data stored in the register RGD1 arranged over the base chip 2 is newer data than the write data stored in the register RGD2 arranged over the memory chip 3. Thus, when there is coincidence between the externally supplied read address and the write address stored in the register RGA1, the write data stored in the register RGD1 may be used as read data without using the write data stored in the register RGD2 and the data read from the memory cell array, arranged over the memory chip 3.

In this case, the gating circuit 26 stops accessing the memory chip 3, when the externally supplied read address coincides with the write address stored in the register RGA1. Specifically, the circuit stops supplying the address signal ADD to the memory chip 3 and supplying the command signal CMD. As a result, it is possible to temporarily stop the operation of the memory 3, thus reducing the consumption power.

As seen from the timing chart of FIG. 6, for example, upon input of the command signal CMD for instructing data reading for the Bank0 and the read address RA0 (time t14), a comparison is made between the read address RA0 and the write address stored in the register RGA1 for the Bank0 arranged over the base chip 2 (time t15).

When there is coincidence therebetween, after the read command is input (time t14), after the elapse of the read latency tRL (nine cycles), the write data stored in the register RGD1 for the Bank0 arranged over the base chip 2 is read as read data (time t23). At this time, the gating circuit 26 stops supplying the read command and the read address RA0 for the memory chip 3. As a result, the operation of the memory chip 3 is temporarily stopped (times t17 to t21), and thus reducing the consumption power.

When the externally supplied read address does not coincide with the write address stored in the register RGA1, but coincides with the write address stored in the register RGA2, only the late write control circuit LW2 of the memory chip 3 may be operated, and the operation of the memory cell array 351 may temporarily be stopped.

Figure 7:
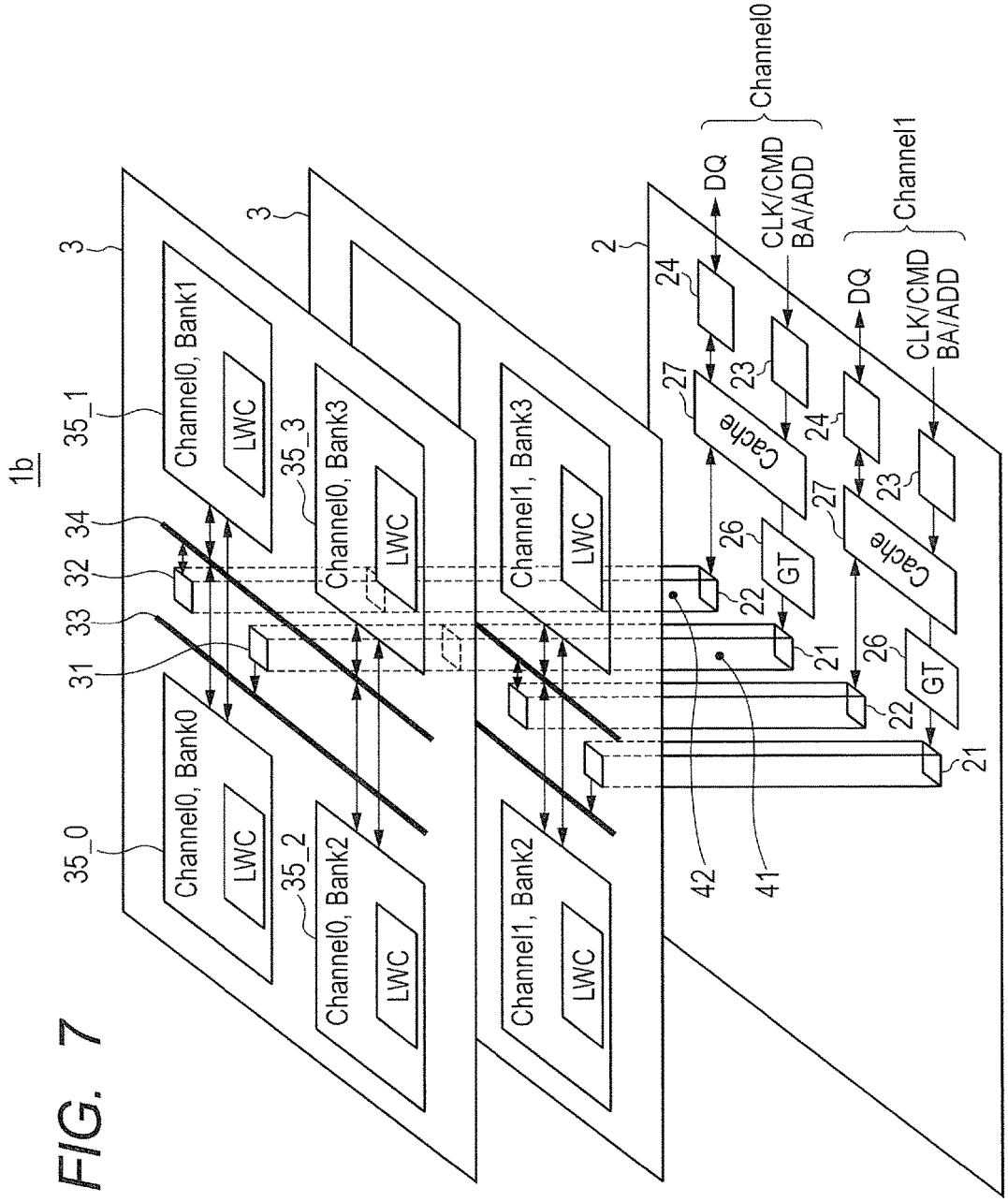
FIG. 7 is a diagram schematically illustrating a stacked structure of a modification of the stack memory illustrated in FIG. 4.

On the base chip 2, a logic process may be adopted instead of the memory process. This enables high integration. In this case, the late write control circuit LW1 may be a cache memory 27 including functions of the register RGA1 storing the write address and the RGD1 storing the write data, like the stack memory 1b illustrated in FIG. 7. This results in increasing the probability of coincidence between the address at the time of reading data and a plurality of write address stored in the cache memory 27, thus increasing the probability of stopping the operation of the memory chip 3 and performing the closed operation only over the base chip 2. As a result, it is possible to further suppress the increase in the consumption power.

Embodiment 3

Figure 8:
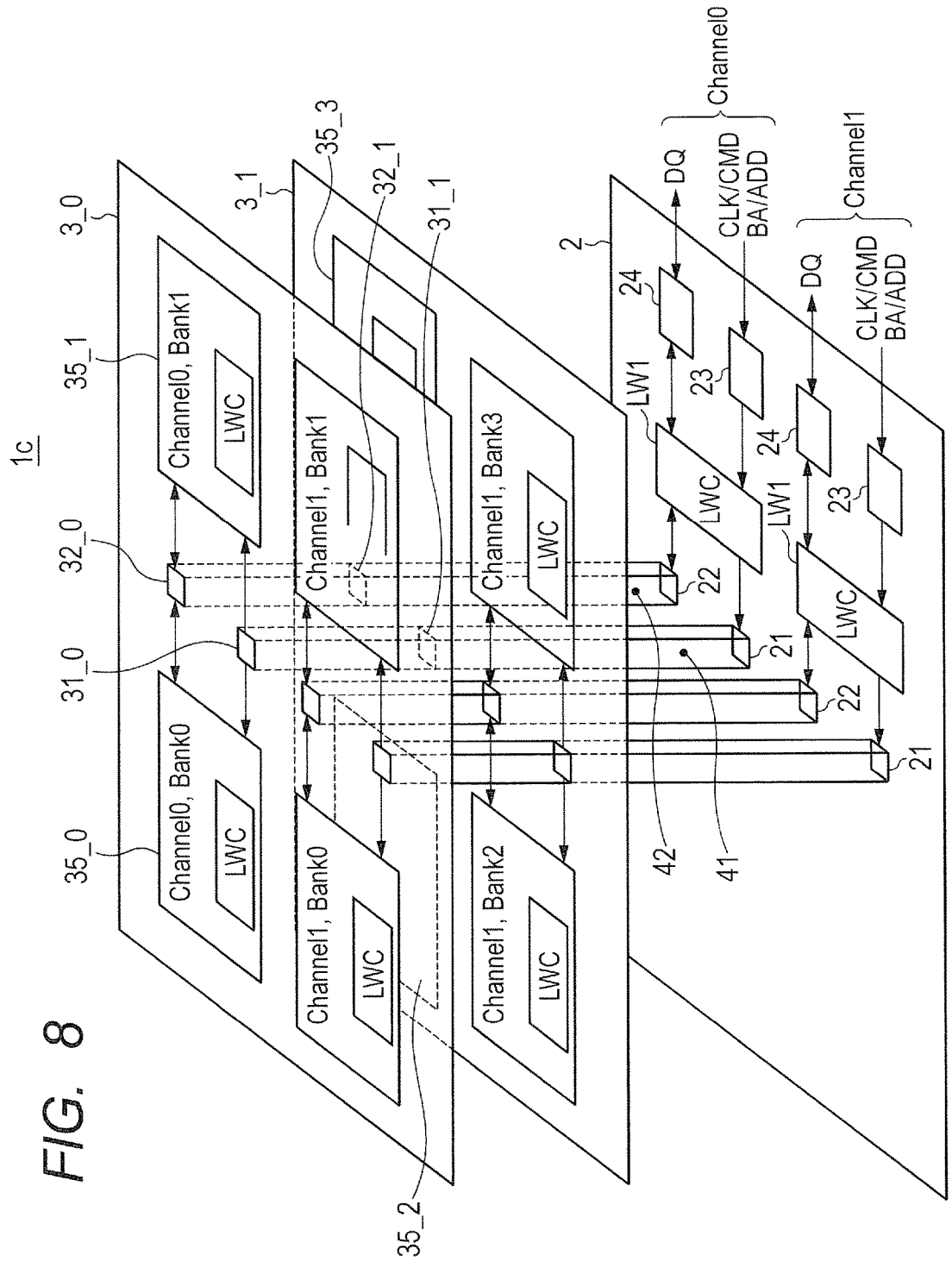
FIG. 8 is a diagram schematically illustrating a stacked structure of a stack memory according to an embodiment 3.
Figure 9A:
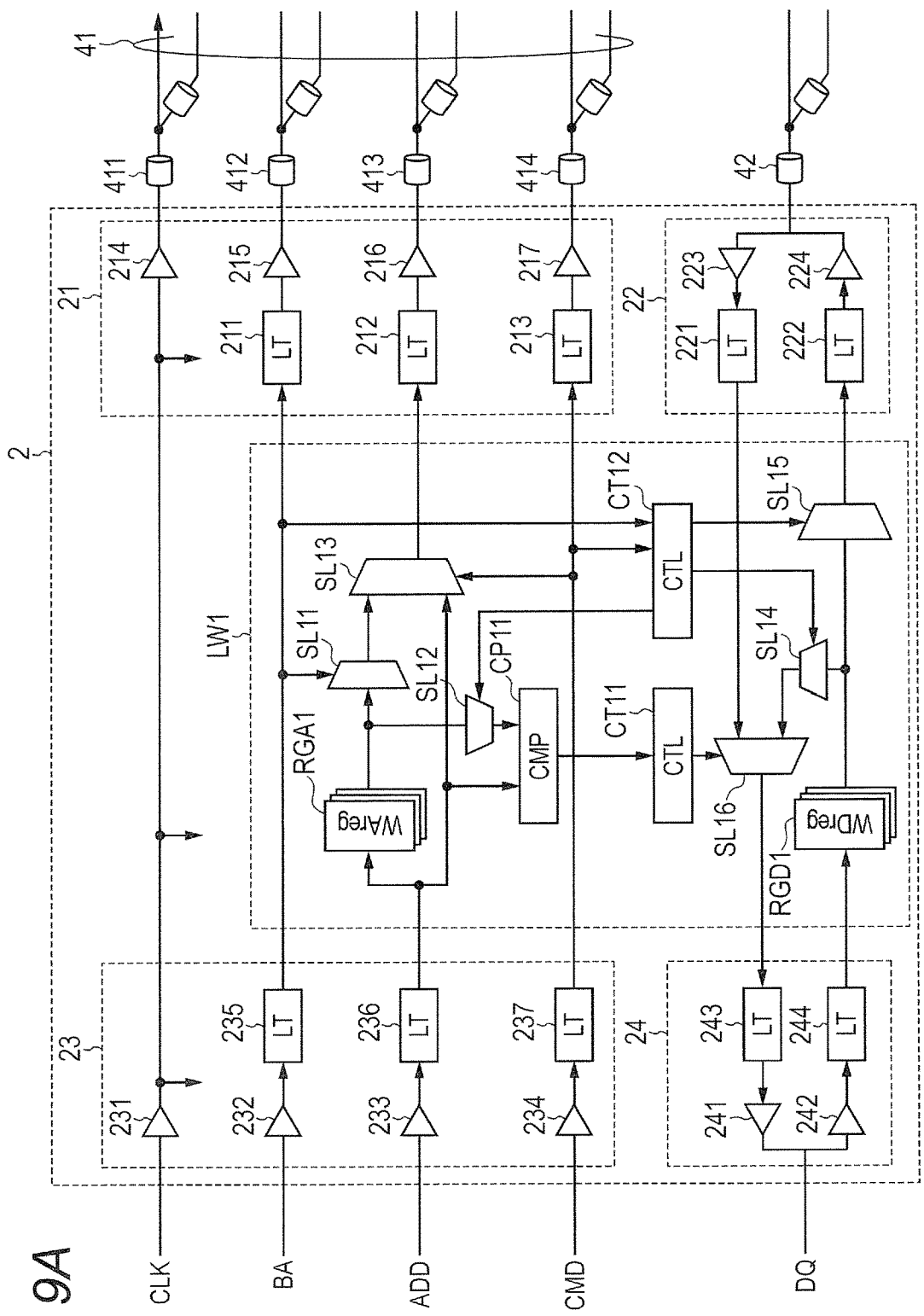
FIG. 9A is a block diagram illustrating a configuration example of the base chip side of the stack memory illustrated in FIG. 8.
Figure 9B:
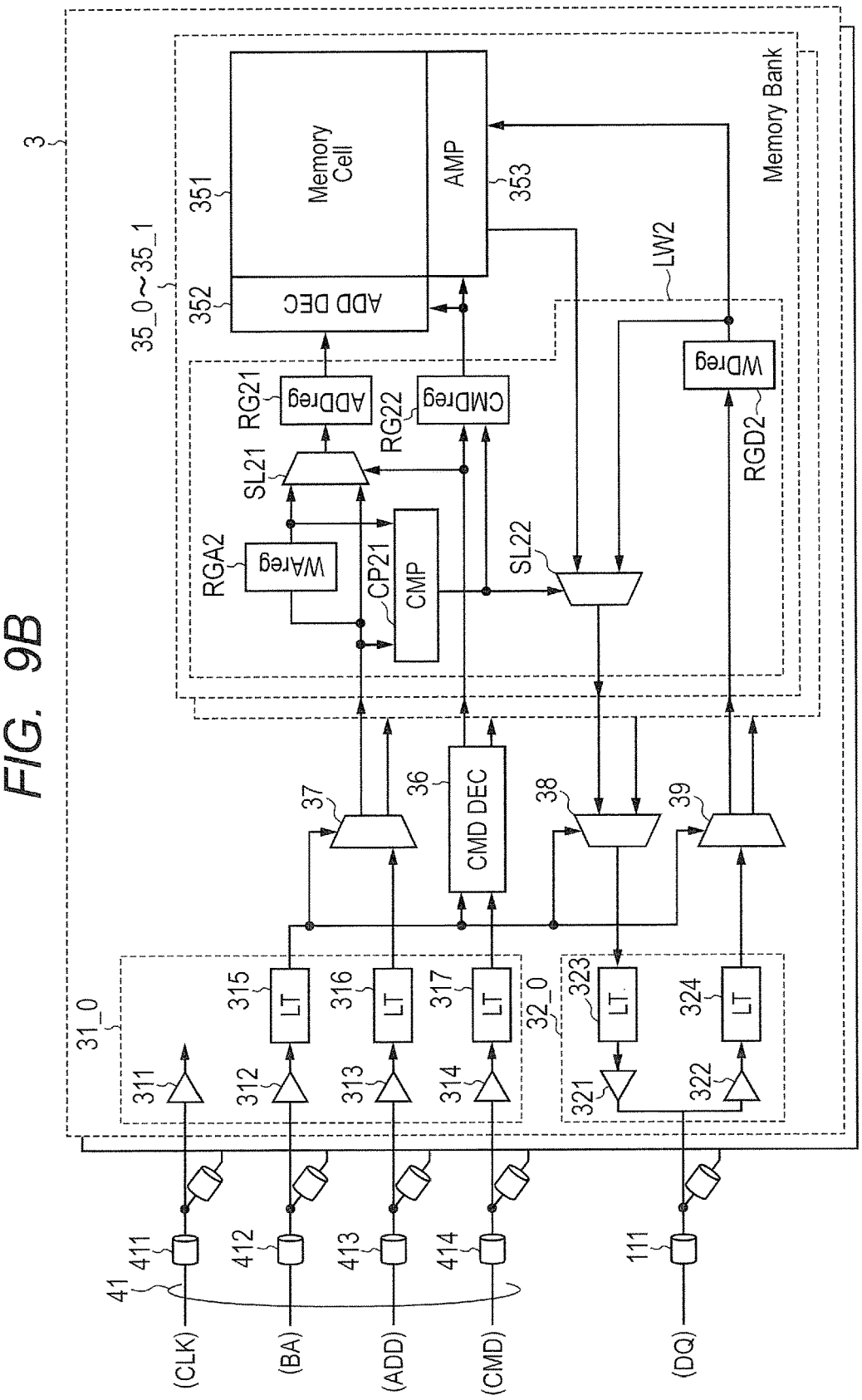
FIG. 9B is a block diagram illustrating a configuration example of a part of the memory chip side of the stack memory illustrated in FIG. 8.

FIG. 8 is a diagram schematically illustrating a stacked structure of a stack memory 1c according to an embodiment 3. FIG. 9A is a block diagram illustrating a configuration example of the base chip side of the stack memory 1c. FIG. 9B is a block diagram illustrating only the one channel of the memory chip side of the stack memory 1c.

In the stack memory 1c, the same channel memory banks 35_0 to 35_3 are separated and provided on different memory chips 3_0 and 3_1.

Specifically, the memory banks 35_0 and 35_1 and the interface circuits 31_0 and 32_0 are provided over the memory chip 3_0. Over the memory chip 3_1, the memory banks 35_2 and 35_3 and the interface circuits 31_1 and 32_1 are provided. The interface circuits 31_0 and 31_1 correspond to the interface circuit 31, and are both coupled to the via 41. The interface circuits 32_0 and 32_1 correspond to the interface circuit 32, and are both coupled to the via 42.

Note that the stack memory 1c uses selectors 37, 39, and 38, instead of using the buses 33 and 34. The selector 37 selects a memory bank of an output source of the address signal ADD, the selector 39 selects a memory bank of an output source of write data, and the selector 38 selects a memory bank of an output source of read data (see FIG. 9B). Any other configurations of the stack memory 1c are the same as those of the stack memory 1, and thus will not be described over and over.

The stack memory 1c provides the same effects as those of the stack memories 1 and 1a. Further, the stack memory 1c does not use the buses 33 and 34, and can suppress an increase in the size of the circuit and an increase in the consumption power.

Embodiment 4

Figure 10:
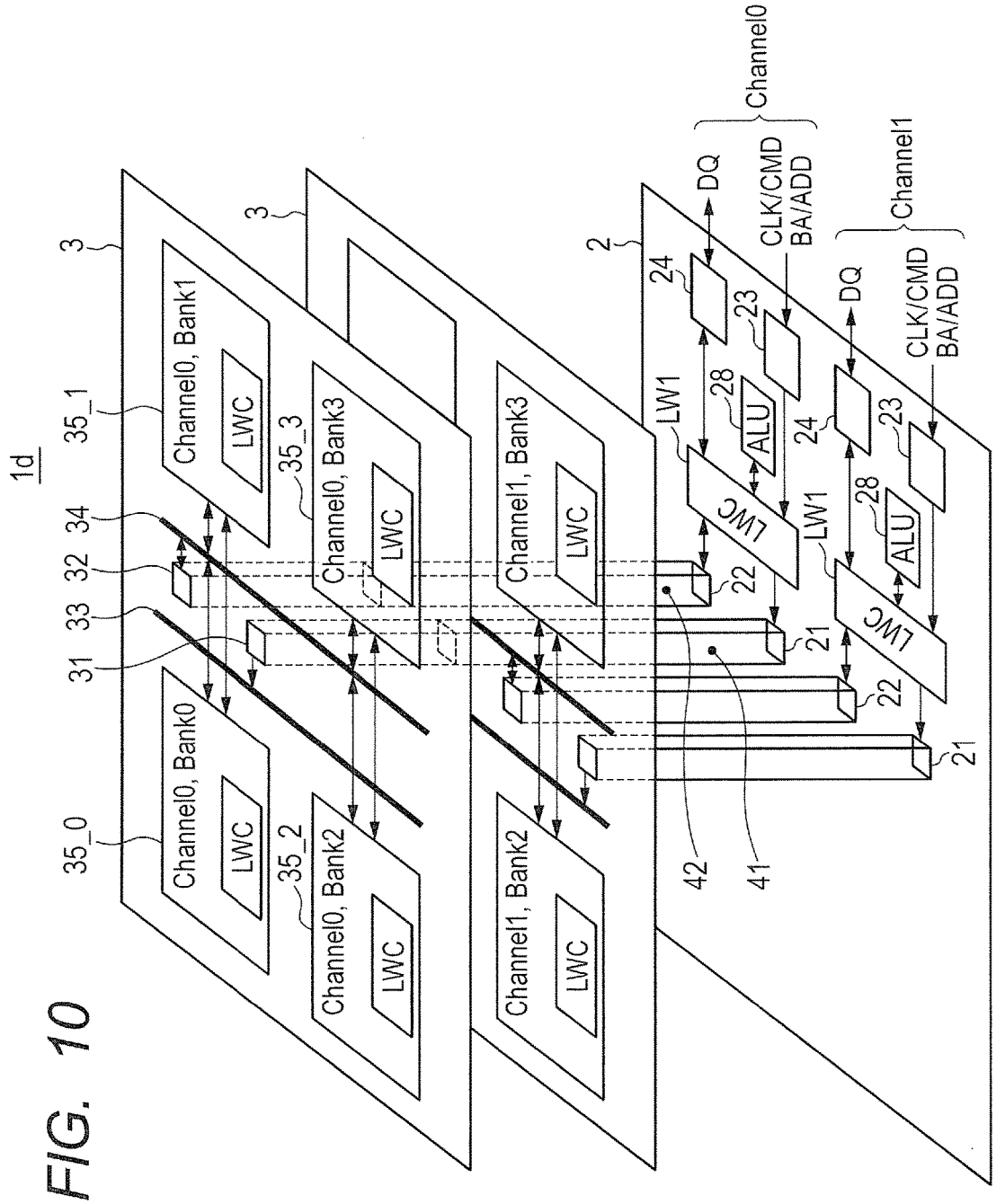
FIG. 10 is a diagram schematically illustrating a stacked structure of a stack memory according to an embodiment 4.
Figure 11A:
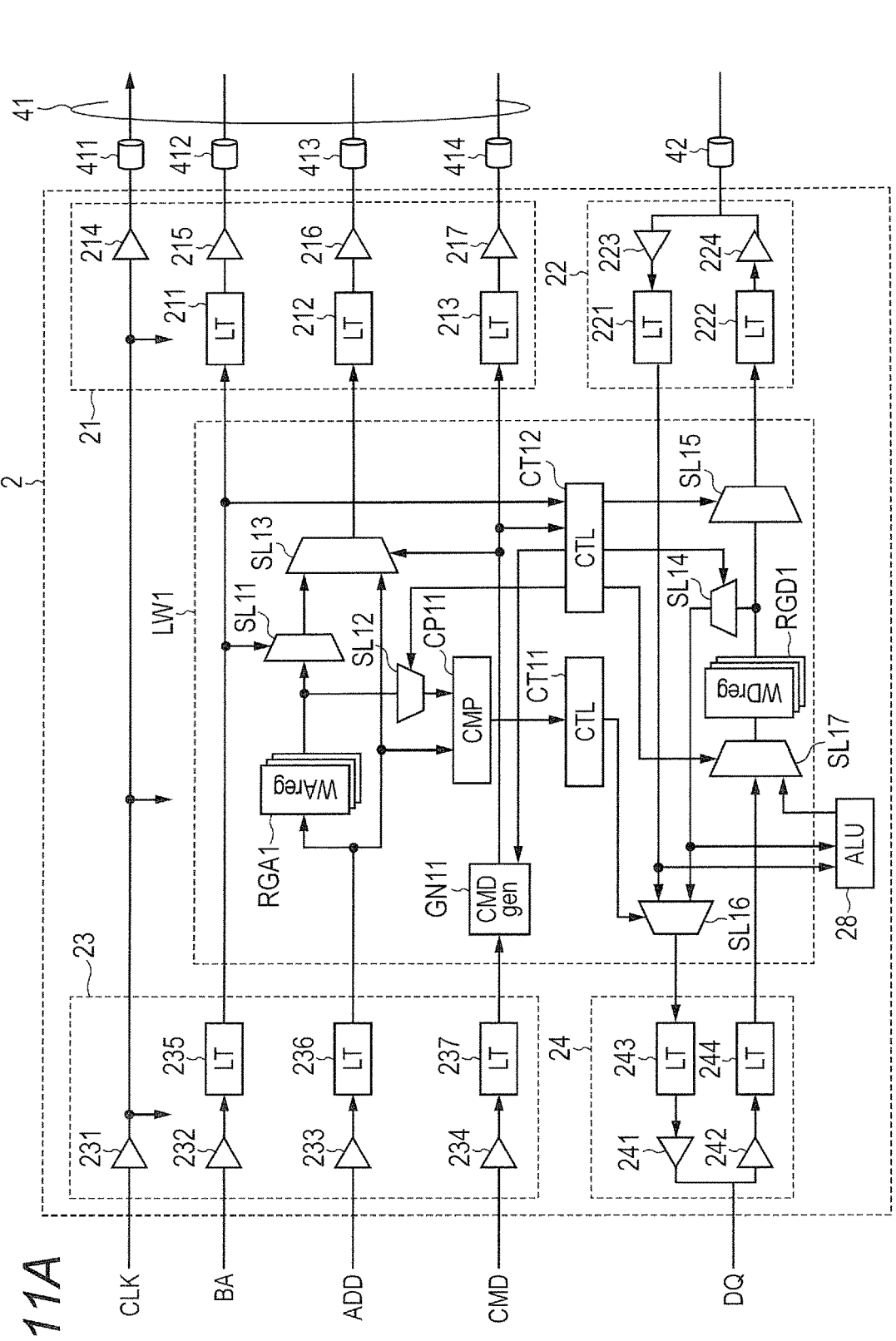
FIG. 11A is a block diagram illustrating a configuration example of the base chip side of the stack memory illustrated in FIG. 10.
Figure 11B:
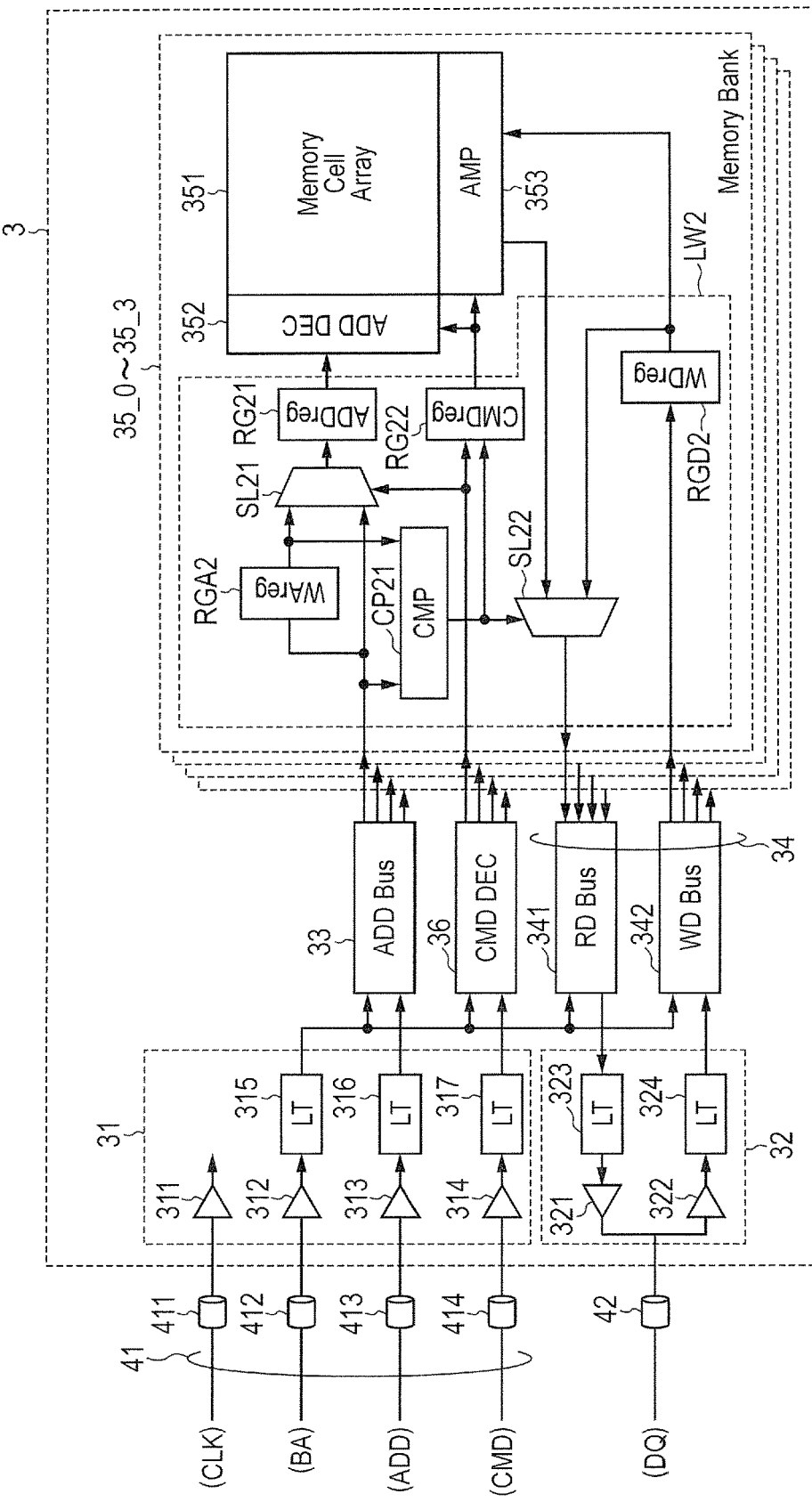
FIG. 11B is a block diagram illustrating a configuration example of a part of the memory chip side of the stack memory illustrated in FIG. 10.
Figure 12:
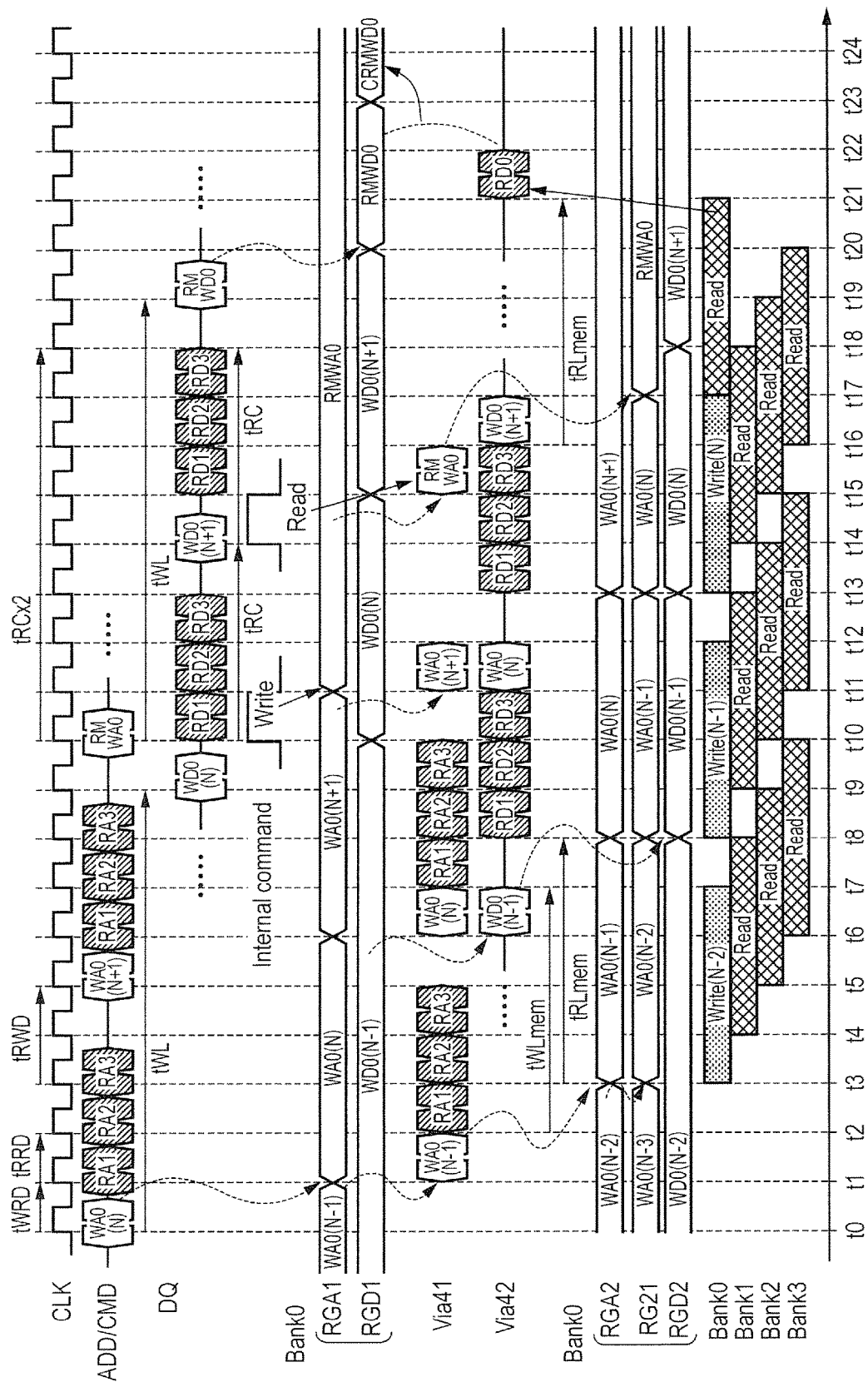
FIG. 12 is a timing chart illustrating operations of the stack memory illustrated in FIG. 10.

FIG. 10 is a diagram schematically illustrating a stacked structure of a stack memory 1d according to an embodiment 4. FIG. 11A is a block diagram illustrating a configuration example of the base chip side of the stack memory 1d. FIG. 11B is a block diagram illustrating only the one channel of the memory chip side of the stack memory 1d. FIG. 12 is a timing chart illustrating operations of the stack memory 1d.

Unlike the stack memory 1, the stack memory 1d includes an ALU arithmetic logic unit (ALU) 28 corresponding to each memory chip over the base chip 2. By this configuration, the stack memory 1d realizes a read modify write function, in addition to the original function of the late write control circuit LW1.

The arithmetic logic unit 28 generates an arithmetic value in place of the write data, and executes a predetermined arithmetic process based on the arithmetic value stored in the register RGD1 and data read from a target memory cell for writing-back. An arithmetic result by the arithmetic logic unit 28 is stored in the register RGD1 as new write data. The arithmetic contents of the arithmetic logic unit 28 include, for example, addition and subtraction of read data and an input arithmetic value, an arithmetic operation of exclusive OR, and an arithmetic operation of left-shift and right shift of read data by an input arithmetic value. The kinds of arithmetic operation may be selected based on the command contents at the time of inputting a read modify write command, or selected by the mode register.

The late write control circuit LW1 further includes a selector SL17 and a command generation circuit GN11.

The selector SL17 selects and outputs either of write data supplied externally through the external interface circuit 24 and an arithmetic result by the arithmetic logic unit 28. Specifically, when a read modify write command is input as a command signal CMD, the selector SL17 selects and outputs an arithmetic result by the arithmetic logic unit 28 after the elapse of a predetermined cycle(s). In any other case (that is, in the case of a normal operation), it selects and outputs write data supplied externally through the external interface circuit 24.

The command generation circuit GN11 is a circuit automatically generating a read command for a target memory cell for writing-back. Specifically, when a read modify write command is input as a command signal CMD, the command generation circuit GN11 generates a read command for a target memory cell for writing-back, after the elapse of a period tRC. The read modify write operation is a combination of a reading operation and a writing operation, and it takes twice as long as the period tRC.

As seen from the timing chart of FIG. 12, an address RMWA0 of the target memory cell for writing-back is stored in the register RGA1 (time t11), for example, when the read modify write command as a command CMD and the address RMWA0 of the target memory cell for writing-back are input (time t10). After the elapse of the write latency tWL, an arithmetic value RMWD0 is input in place of the write data (time t19), and stored in the register RGD1 (time t20). That is, the same operation as the normal data wiring operation is executed.

After the read modify write command is input, and after the elapse of the period tRC, a read command for the target memory cell for writing-back is automatically generated (time t14). As a result, data RD0 is read from the target memory cell for writing-back (time t21).

After this, the arithmetic logic unit 28 executes an arithmetic operation based on the arithmetic value RMWD0 stored in the register RGD1 and the data RD0 read from the target memory cell for writing-back (time t22). The arithmetic result by the arithmetic logic unit 28 is written in the register RGD1, as new write data CRMWD0 (time t23).

After this, the write data CRMWD0 is written back in the memory cell, through the same operation as the normal data writing operation.

Before the new write data CRMD0 is written into the memory cell, when the read command for this memory cell is input, needless to say, the write data CRMD0 may be output as read data.

In this manner, the stack memory 1d can provide the same effects as those of the stack memory 1, and can realize the read modify write function, using a minimum additional circuit.

Accordingly, in the stack memory according to the above-described embodiments 1 to 4, the late write control circuit is provided not only over each memory chip, but also over the base chip. By this configuration, the length of the write latency tWLmem and the length of the read latency tRLmem of the single memory chip are uniformly aligned, and the length of the write latency tWL and the length of the read latency tRL of the entire stack memory are uniformly aligned. At this time, there does not occur collision of read data and write data in the internal interface circuit, even without adjusting the bus turn around period to a long period. Thus, it is possible to shorten the bus turn around period of the entire stack memory 1. As a result, it is possible to improve the processing performance of the stack memory 1.

Accordingly, the inventions of the present inventors have concretely been described based on the embodiments. However, the present invention is not limited to the embodiments, various changes may possibly be made without departing from the scope thereof. The configurations of the embodiments 1 to 4 may partially or entirely be combined appropriately with each other.

For example, in the configuration of the semiconductor memory device according to the above-described embodiments, it is possible to invert the conductive type (p-type or n-type) of the semiconductor substrate, the semiconductor layer, and the diffusion layer (diffusion area). When one of the conductive types of the n-type and p-type is assumed as a first conductive type, and the other conductive type is assumed as a second conductive type, the first conductive type may be the p-type, while the second conductive type may be the n-type. On the contrary, the first conductive type may be the n-type, while the second conductive type may be the p-type.

What is claimed is:

1. A semiconductor memory device comprising:
    a base chip;
    a first memory chip which is stacked over the base chip; and
    a first through via which is provided between the base chip and the first memory chip, and is used for transmitting read data and write data,
    wherein the base chip has
        an external interface circuit which externally receives/transmits the write data and the read data, and
        a first late write control circuit which has a plurality of first registers storing the write data supplied externally through the external interface circuit and transferring a previous write data stored therein in response to a write command,
    wherein the first memory chip has
        a memory cell array which has a plurality of memory cells arranged in a matrix, and
        a plurality of second late write control circuits, each of which second late write control circuit has at least a second register storing the write data supplied from the first registers through the first through via and transferring the previous write data stored therein, and writes the previous write data output from the second register into a target memory cell for writing,
    wherein the first memory chip includes a plurality of memory banks of a same channel, a second late write control circuit is provided correspondingly to each one of the memory banks, a number of the first registers corresponds to a number of the memory banks, and
    wherein one of the first registers is selected, based on a bank address, and the data stored in the selected first register is transferred.

2. The semiconductor memory device according to claim 1, further comprising a second memory chip which is stacked over the base chip, and wherein each of the first and second memory chips includes a plurality of memory banks of a same channel, formed of the memory cell array, and a plurality of the second late write control circuits corresponding to the memory cell array.

3. The semiconductor memory device according to claim 1,
    wherein each second late write control circuit includes a plurality of pipelined second registers.

4. The semiconductor memory device according to claim 1, wherein each first late write control circuit incorporates a cache memory as the first register.

5. The semiconductor memory device according to claim 1,
    wherein each first late write control circuit outputs write data stored in the first register as read data, when there is coincidence between an address signal corresponding to the write data stored in the first register and an externally supplied address signal for data reading.

6. The semiconductor memory device according to claim 5,
wherein each second late write control circuit outputs write data stored in the second register as read data, when there is coincidence between an address signal corresponding to the write data stored in the second register and an externally supplied address signal for data reading.

7. The semiconductor memory device according to claim 5, further comprising
a gating circuit which stops supplying the address signal for data reading to the memory cell array, when there is coincidence between an address signal corresponding to write data stored in the first register and an externally supplied address signal for data reading.

8. The semiconductor memory device according to claim 1,
wherein the base chip further includes an arithmetic unit, which generates an arithmetic value in place of write data and executes a predetermined arithmetic operation based on the arithmetic value stored in the first register and data read from a target memory cell for writing-back, and
wherein an arithmetic result by the arithmetic unit is stored in the first register as new write data.

9. The semiconductor memory device according to claim 1, further comprising a second through via provided between the base chip and the first memory chip, and used for transmitting an address signal,
wherein each first late write control circuit further comprises a first address register storing an address signal supplied externally through the external interface circuit and transferring a previous address signal stored therein in response to the write command, and
wherein each second late write control circuit further comprises a second address register storing the address signal supplied from the first address register through the second through via and transferring a previous address signal stored therein in response to a succeeding write command.

10. A semiconductor memory device, comprising:
a base chip;
a first memory chip which is stacked over the base chip; and
a first through via provided between the base chip and the first memory chip,
wherein the base chip comprises:
an external interface circuit which externally receives/transmits write data and read data; and
a first late write control circuit comprising a plurality of first registers storing the write data supplied externally through the external interface circuit and transferring previous write data stored therein in response to a write command, and
wherein the first memory chip comprises:
a memory cell array comprising a plurality of memory cells arranged in a matrix; and
a plurality of second late write control circuits, each of the second late write control circuits comprising at least a second register storing a first write data supplied from the first register through the first through via, transferring previous second write data stored therein, and writing the second write data output from the second register into a target memory cell,
wherein the first memory chip includes a plurality of memory banks of a same channel, one each of the second late write control circuits is provided for a corresponding one of the memory banks, a number of the first registers corresponding to a number of the memory banks, and
wherein one of the first registers is selected, based on a bank address, and the data stored in the selected first register is transferred.

* * * * *